(12) United States Patent
Takatani et al.

(10) Patent No.: US 10,096,583 B2
(45) Date of Patent: Oct. 9, 2018

(54) METHOD FOR FABRICATING A SEMICONDUCTOR INTEGRATED CHIP

(71) Applicant: WIN Semiconductors Corp., Tao Yuan Shien (TW)

(72) Inventors: Shinichiro Takatani, Tao Yuan Shien (TW); Hsien-Fu Hsiao, Tao Yuan Shien (TW); Cheng-Kuo Lin, Tao Yuan Shien (TW); Chang-Hwang Hua, Tao Yuan Shien (TW)

(73) Assignee: WIN Semiconductos Corp., Kuei Shan Hsiang, Tao Yuan Shien (TW)

( * ) Notice: Subject to any disclaimer, the term of this patent is extended or adjusted under 35 U.S.C. 154(b) by 0 days.

(21) Appl. No.: 15/370,328

(22) Filed: Dec. 6, 2016

(65) Prior Publication Data

US 2017/0084592 A1    Mar. 23, 2017

Related U.S. Application Data

(63) Continuation-in-part of application No. 14/674,849, filed on Mar. 31, 2015, now Pat. No. 9,673,186, (Continued)

(51) Int. Cl.
*H01L 23/48* (2006.01)
*H01L 21/50* (2006.01)
(Continued)

(52) U.S. Cl.
CPC .......... *H01L 25/18* (2013.01); *H01L 21/0217* (2013.01); *H01L 21/0237* (2013.01); *H01L 21/02118* (2013.01); *H01L 21/76802* (2013.01); *H01L 21/76829* (2013.01); *H01L 21/76877* (2013.01); *H01L 21/8252* (2013.01); (Continued)

(58) Field of Classification Search
CPC ....... H01L 23/48; H01L 21/50; H01L 23/538; H01L 21/60; H01L 21/56; H01L 23/06
USPC .... 257/750, 774, E23.01, E23.011, E21.499, 257/737, E23.068, E23.191, E21.503, 257/E23.174, 686, 690, 704, E23.169; 438/118, 108, 613
See application file for complete search history.

(56) References Cited

U.S. PATENT DOCUMENTS 7,508,267 B1    3/2009  Yu et al.
2005/0110159 A1  5/2005  Oh
(Continued)

*Primary Examiner* — David Vu
*Assistant Examiner* — Mouloucoulaye Inoussa
(74) *Attorney, Agent, or Firm* — Muncy, Geissler, Olds & Lowe, P.C.

(57) ABSTRACT

The present invention relates to a compound semiconductor integrated circuit chip having a front and/or back surface metal layer used for electrical connection to an external circuit. The compound semiconductor integrated circuit chip (first chip) comprises a substrate, an electronic device layer, and a dielectric layer. A first metal layer is formed on the front side of the dielectric layer, and a third metal layer is formed on the back side of the substrate. The first and third metal layer are made essentially of Cu and used for the connection to other electronic circuits. A second chip may be mounted on the first chip with electrical connection made with the first or the third metal layer that extends over the electronic device in the first chip in the three-dimensional manner to make the electrical connection between the two chips having connection nodes away from each other.

5 Claims, 27 Drawing Sheets

Related U.S. Application Data which is a continuation-in-part of application No. 13/751,855, filed on Jan. 28, 2013, now abandoned.

(51) Int. Cl.

| | | |
|---|---|---|
| *H01L 25/18* | (2006.01) | |
| *H01L 23/482* | (2006.01) | |
| *H01L 21/02* | (2006.01) | |
| *H01L 21/768* | (2006.01) | |
| *H01L 21/8252* | (2006.01) | |
| *H01L 23/522* | (2006.01) | |
| *H01L 23/66* | (2006.01) | |
| *H01L 25/065* | (2006.01) | |
| *H01L 29/737* | (2006.01) | |
| *H01L 29/778* | (2006.01) | |
| *H01L 23/532* | (2006.01) | |

(52) U.S. Cl.
CPC .......... *H01L 23/48* (2013.01); *H01L 23/4824* (2013.01); *H01L 23/4827* (2013.01); *H01L 23/5223* (2013.01); *H01L 23/5227* (2013.01); *H01L 23/5228* (2013.01); *H01L 23/5329* (2013.01); *H01L 23/66* (2013.01); *H01L 25/0657* (2013.01); *H01L 21/02378* (2013.01); *H01L 21/02381* (2013.01); *H01L 21/02389* (2013.01); *H01L 21/02395* (2013.01); *H01L 23/481* (2013.01); *H01L 23/53238* (2013.01); *H01L 23/53252* (2013.01); *H01L 29/737* (2013.01); *H01L 29/778* (2013.01); *H01L 2223/6616* (2013.01); *H01L 2223/6644* (2013.01); *H01L 2223/6672* (2013.01); *H01L 2223/6683* (2013.01); *H01L 2224/16145* (2013.01); *H01L 2224/16225* (2013.01); *H01L 2224/32225* (2013.01); *H01L 2224/48091* (2013.01); *H01L 2224/48227* (2013.01); *H01L 2224/73257* (2013.01); *H01L 2224/73265* (2013.01); *H01L 2225/0651* (2013.01); *H01L 2225/06513* (2013.01); *H01L 2225/06517* (2013.01); *H01L 2225/06541* (2013.01); *H01L 2924/00014* (2013.01); *H01L 2924/1305* (2013.01)

(56) References Cited

U.S. PATENT DOCUMENTS

| | | | |
|---|---|---|---|
| 2006/0255443 | A1 | 11/2006 | Hwang |
| 2007/0290326 | A1 | 12/2007 | Yang et al. |
| 2008/0179758 | A1 | 7/2008 | Wong |
| 2010/0125761 | A1 | 5/2010 | Hyun et al. |
| 2011/0062579 | A1 | 3/2011 | Mishra et al. |
| 2011/0316147 | A1* | 12/2011 | Shih ............. H01L 21/486 257/737 |
| 2012/0193785 | A1* | 8/2012 | Lin ............. H01L 21/76229 257/737 |
| 2013/0026631 | A1* | 1/2013 | Min ............. H01L 23/4821 257/750 |

* cited by examiner

METHOD FOR FABRICATING A SEMICONDUCTOR INTEGRATED CHIP

CROSS-REFERENCE TO RELATED DOCUMENTS

The present invention is a continuation-in-part (CIP) application of U.S. patent application Ser. No. 14/674,849 entitled "Semiconductor Integrated Circuit" filed on Mar. 31, 2015. Application Ser. No. 14/674,849 was a CIP application of U.S. patent application Ser. No. 13/751,855 entitled "Semiconductor Integrated Circuit" filed on Jan. 28, 2013.

FIELD OF THE INVENTION

The present invention relates to a semiconductor integrated circuit chip having a front and/or back surface metal layer used for electrical connection to an external circuit, and more particularly to a semiconductor integrated circuit with multiple stacked electronic circuit chips, in which at least one of them is a compound semiconductor MIMIC chip.

BACKGROUND OF THE INVENTION

Compound semiconductor monolithic microwave integrated circuits (MMICs) have been widely used for the RF transmitter, receiver, and transceiver in microwave communication devices such as cell phones and wireless LAN modules. The RF modules are composed of many circuit elements such as power amplifiers (PAs), switches, filters, and control devices. Some of those circuit elements are integrated in one chip. A compound semiconductor amplifier (HBT or HEMT) often uses circuits using HEMTs for controlling the transistor bias condition. Those circuits can be integrated in one compound semiconductor chip. For example, the integration of HBTs and HEMTs is achieved by using a BiFET (or BiHEMT) process, in which both HBT PAs and HEMT control circuits are fabricated in a compound semiconductor chip. Another example is to use a process in which enhancement-mode HEMTs and depletion-mode HEMTs are integrated. The enhancement-mode HEMTs are used for a PAs and the depletion-mode HEMTs are used for the control circuits. A compound semiconductor amplifier (HBT or HEMT) and a switch circuit that changes the RF signal path depending on the output power level, frequency band, and the communication mode are also often integrated in one chip. A compound semiconductor amplifier (HBT or HEMT) and an antenna switch circuit that switches the connection of the antenna to different Tx and Rx circuits are also often integrated in one chip. The compound semiconductor HBT PA is often operated at different bias conditions for the different output powers and frequencies to maintain an optimal performance. Since the input and output impedances are functions of the bias condition, an impedance tuner is introduced to maintain a good impedance matching in accordance with the change in the bias condition. The impedance tuner usually consists of capacitors, inductors and HEMT switches. The HEMT switch is used to change the connection of the capacitor and inductor to change the overall impedance. The high integration of circuit elements induces high process cost and low process yield. That is particularly the case when both HBT and HEMT are integrated on one chip.

To reduce the process cost, the circuit elements of the RF module described above can be formed on separate chips, and other electronic chips such as Si CMOS chip can be included. Conventionally, the chips are placed in one plane. However, the use of multiple chips in one plane makes the module size large, and the long interconnection between those chips induces signal loss and interference. An example of such an RF module is the one consisting of an HBT PA MIMIC chip, impedance matching and bias control chip, an antenna switch chip, and a filter circuit chip, all of which are placed in one plane on the module substrate.

SUMMARY OF THE INVENTION

The present invention provides a compound semiconductor integrated circuit chip having a front and/or back surface metal layer used for electrical connection to an external circuit. Its main object is to provide a semiconductor integrated circuit, which comprises stacked electronic chips, in which at least one of the chips is a compound semiconductor electronic integrated circuit chip. The footprint of a module composed of the semiconductor integrated circuit with stacked chips can be reduced significantly. The manufacturing processes of the chips are reduced compared with the case in which the circuit elements are integrated in one chip. The interconnections between chips or between two circuit elements can be made short, and thereby the signal loss and interference can be reduced. The metal layer formed over the device active region make it possible to connect nodes in two chips at positions apart from each other horizontally, and thereby there is more freedom in the layout design of the connection nodes.

To reach the objects stated above, the present invention provides a semiconductor integrated circuit comprising a first chip, which contains a compound semiconductor integrated circuit. The first chip comprises a substrate, a dielectric layer, an electronic device layer, and a first metal layer. The dielectric layer is formed above the substrate and has at least one dielectric layer via hole penetrating from a first surface to a second surface of the dielectric layer. The first metal layer is made essentially of Cu. The first metal layer forms at least one first pad on the first surface of the dielectric layer and extends into one dielectric layer via hole. The electronic device layer is formed between the substrate and the dielectric layer and contains at least one electronic device including at least one compound semiconductor electronic device and at least one second metal layer, in which at least one of the at least one second metal layer is connected to the at least one electronic device, and at least one of the at least one second metal layer also forms at least one second pad placed at the end of one dielectric layer via hole at the second surface of the dielectric layer, at which the second pad is electrically connected to the first metal layer that extends into the dielectric layer via hole. All of the at least one second metal layer in contact with the at least one compound semiconductor electronic device is made essentially of Au. At least one first pad is electrically connected to the second pad at the other end of the dielectric layer via hole by the first metal layer that extends over at least one of the at least one electronic device in the electronic device layer.

Furthermore, the present invention provides a semiconductor integrated circuit, which comprises the aforementioned first chip and a second chip. The second chip contains an electronic circuit. The first surface of the dielectric layer of the first chip defines the front surface of the first chip, and the surface of the substrate of the first chip opposite to the dielectric layer defines the back surface of the first chip. The second chip is stacked on the front surface of the first chip and electrically connected to the at least one first pad. To align the electrical connection points in the two chips, the at least one first pad is electrically connected to the second pad at the other end of the dielectric layer via hole by the first metal layer that extends over at least one of the at least one electronic device in the electronic device layer.

The present invention also provides a method for fabricating a semiconductor integrated circuit described above, comprising the process steps below in the same order:

1. growing at least one compound semiconductor epitaxial layer on a substrate of a chip;
2. fabricating at least one compound semiconductor electronic device on the substrate using the at least one compound semiconductor epitaxial layer;
3. depositing at least one second metal layer made essentially of Au above the at least one compound semiconductor epitaxial layer to form an electrical connection to at least one of the at least one compound semiconductor electronic device, and also to form at least one second pad;
4. depositing a SiN layer above the at least one second metal layer for passivation or protection of the at least one compound semiconductor electronic device (hereafter, the layer comprising the at least one compound semiconductor electronic device, the at least one second metal layer, and the SiN layer as an electronic device layer);
5. depositing a dielectric layer above the electronic device layer;
6. forming at least one dielectric layer via hole penetrating through the dielectric layer for the electrical contact to the at least one second pad; and
7. depositing a first metal layer made essentially of Cu on the dielectric layer forming at least one first pad on the dielectric layer, extending from the each first pad into the at least one dielectric layer via hole and connecting to the at least one second pad, where the first metal layer extends from at least one of the at least one first pad three-dimensionally over at least one of the at least one compound semiconductor device, then into the at least one dielectric layer via hole and connects to the at least one second pad.

In the fabrication method described above, the electronic device layer is formed on the substrate as a front-end process. The topmost surface is protected by SiN. The process containing Cu, on the other hand, is performed on the surface protected by SiN. In this way, the contamination of compound semiconductor device by Cu is prevented. The first pad may be used to connect another chip to the chip.

The present invention provides another semiconductor integrated circuit comprising a first chip and a second chip, in which the first chip contains a compound semiconductor integrated circuit and the second chip contains an electronic circuit. The first chip comprises a substrate, a dielectric layer, an electronic device layer, a first metal layer, and a third metal layer. The substrate has at least one through substrate via hole penetrating from a front side to a backside of the substrate. The dielectric layer is formed above the front side of the substrate and has at least one dielectric layer via hole penetrating from a first surface to a second surface of the dielectric layer. The first metal layer is made essentially of Cu. The first metal layer forms at least one first pad on the first surface of the dielectric layer and extends into one dielectric layer via hole. The electronic device layer is formed between the substrate and the dielectric layer and contains at least one electronic device including at least one compound semiconductor electronic device and at least one second metal layer, in which at least one of the at least one second metal layer is connected to the at least one electronic device, at least one of the at least one second metal layer also forms at least one second pad placed at the end of one dielectric layer via hole at the second surface of the dielectric layer, at which the second pad is electrically connected to the first metal layer that extends into the dielectric layer via hole, and at least one of the at least one second metal layer also forms at least one third pad at the end of the through substrate via hole at the front side of the substrate. All of the at least one second metal in contact with the at least one compound semiconductor electronic device is made essentially of Au. The third metal layer forms at least one fourth pad on the backside of the substrate and extends into one through substrate via hole to make an electrical connection to the third pad disposed at the other end of the through substrate via hole. The first surface of the dielectric layer defines the front surface of the first chip, and the backside of the substrate defines the back surface of the first chip. The second chip is stacked on the back surface of the first chip and electrically connected to the at least one fourth pad. To align the electrical connection points in the two chips, the first pad is electrically connected to the second pad at the other end of the dielectric layer via hole by the first metal layer that extends over at least one of the at least one electronic device in the electronic device layer.

The present invention also provides a method for fabricating semiconductor integrated circuit described above, comprising the process steps below in the same order:

1. growing at least one compound semiconductor epitaxial layer on a substrate of a chip;
2. fabricating at least one compound semiconductor electronic device on the substrate using the at least one compound semiconductor epitaxial layer;
3. depositing at least one second metal layer made essentially of Au above the at least one compound semiconductor epitaxial layer to form an electrical connection to at least one of the at least one compound semiconductor electronic device, and also to form at least one second pad and at least one third pad;
4. depositing a SiN layer above the at least one second metal layer for passivation or protection of the at least one compound semiconductor electronic device (hereafter, the layer comprising the at least one compound semiconductor electronic device, the at least one second metal layer, and the SiN layer as an electronic device layer);
5. depositing a dielectric layer above the electronic device layer;
6. forming of at least one dielectric layer via hole penetrating through the dielectric layer for the electrical contact to the at least one second pad;
7. depositing a first metal layer made essentially of Cu on the dielectric layer forming at least one first pad on the dielectric layer, extending from the each first pad into the at least one dielectric layer via hole and connecting to the at least one second pad, where the first metal layer extends from at least one of the at least one first pad three-dimensionally over at least one of the at least one compound semiconductor device, then into the at least one dielectric layer via hole and connects to the at least one second pad;
8. forming of at least one through substrate via hole penetrating through the substrate from a backside of the substrate reaching the at least one third pad; and
9. depositing third metal layer on the backside of the substrate forming at least one fourth pad on the backside of the substrate, extending from the each fourth pad into the at least one through substrate via hole and connecting to the at least one third pad.

In the fabrication method described above, the electronic device layer is formed on the substrate as a front-end process. The topmost surface is protected by SiN. The process containing Cu, on the other hand, is performed on the surface protected by SiN. In this way, the contamination of compound semiconductor device by Cu is prevented. The fourth pad may be used to connect another chip to the chip.

The present invention provides another semiconductor integrated circuit comprising a first chip and a second chip, in which the first chip contains a compound semiconductor integrated circuit and the second chip contains an electronic circuit. The first chip comprises a substrate, an electronic device layer, and a third metal layer. The substrate has at least one through substrate via hole penetrating from a front side to a backside of the substrate. The electronic device layer is formed on the front side of the substrate and contains at least one electronic device including at least one compound semiconductor electronic device and at least one second metal layer, in which at least one of the at least one second metal layer is connected to the at least one electronic device, and at least one of the at least one second metal layer also forms at least one third pad at the end of the through substrate via hole at the front side of the substrate. The third metal layer forms at least one fourth pad on the backside of the substrate and extends into one through substrate via hole to make an electrical connection to the third pad disposed at the other end of the through substrate via hole. The third pad is electrically connected, directly or indirectly, by the at least one second metal layer to at least one of the at least one electronic device. The third pad may also be connected to a fifth pad formed by the at least one second metal layer and placed at or in the vicinity of the surface of the electronic device layer opposite to the substrate. The fifth pad may further connected to other circuit chips or electronic modules. The surface of the electronic device layer opposite to the substrate defines the front surface of the first chip, and the backside of the substrate defines the back surface of the first chip. The second chip is stacked on the back surface of the first chip and electrically connects to the fourth pad. To align the electrical connection points in the two chips, the fourth pad is electrically connected to the third pad at the other end of the through substrate via hole by the third metal layer that extends over one of the at least one electronic device in the electronic device layer.

The present invention also provides a method for fabricating semiconductor integrated circuit described above, comprising the process steps below in the same order:

1. growing at least one compound semiconductor epitaxial layer on a substrate of a chip;
2. fabricating at least one compound semiconductor electronic device on the substrate using the at least one compound semiconductor epitaxial layer;
3. depositing at least one second metal layer made essentially of Au above the at least one compound semiconductor epitaxial layer to form an electrical connection to at least one of the at least one compound semiconductor electronic device, and also to form at least one third pad;
4. forming at least one through substrate via holes penetrating through the substrate from a backside of the substrate reaching the at least one third pad; and
5. depositing third metal layer made essentially of Cu on the backside of the substrate forming at least one fourth pad on the backside of the substrate, extending from the each fourth pad into the at least one through substrate via hole and connecting to the at least one third pad, where the third metal layer extends from at least one of the at least one fourth pad three-dimensionally over at least one of the at least one compound semiconductor device, then into the at least one through substrate via hole and connects to the at least one third pad.

In the fabrication method above, the electronic device layer is formed as a front-end process made on the substrate. The process containing Cu, on the other hand, is made on the backside of the substrate. In this way, the contamination of compound semiconductor device by Cu is prevented. The fourth pad may be used to connect another chip to the chip. The use of Cu for the third metal layer reduces the signal loss due to the electrical connection between the main compound semiconductor integrated circuit and another chip.

Another object of the present invention is to provide a semiconductor integrated circuit, in which the back side metal layer of a chip can form an inductor. The inductor on the back side of the chip further save the space the whole circuit occupies, and therefore the chip size can be reduced. The high quality factor for the inductor on the back side of the chip can be obtained when the back side metal layer contains Cu.

To reach the object stated above, the present invention provides another semiconductor integrated circuit, which further includes an inductor in the semiconductor integrated circuit described above. The inductor is formed by the third metal layer on the backside of the substrate of the first chip over at least one of the at least one electronic device. The inductor is electrically connected to the first chip, the second chip, or both the first chip and the second chips.

In implementation, all of the at least one second metal layer are made essentially of Au.

In implementation, the substrate of the first chip described above is made of GaAs.

In implementation, the dielectric layer described above is made of Polybenzoxazole (PBO).

In implementation, the thickness of the dielectric layer described above is 10 μm or thicker.

In implementation, the third metal layer is made essentially of Cu.

In implementation, the first chip described above contains a heterojunction bipolar transistor (HBT) monolithic microwave integrated circuit (MMIC) or a high electron mobility transistor (HEMT) MMIC.

In implementation, the first chip described above contains a GaN field effect transistor (FET).

In implementation, the first chip described above contains a power amplifier MMIC.

In implementation, the second chip described above contains a bias control circuit that controls the bias condition of the at least one electronic device in the first chip, a switching circuit that controls the signal path in the first chip, an antenna switching circuit that connects the output from the power amplifier in the first chip to an antenna, an impedance tuner circuit that gives variable impedance depending on the bias condition and the operating frequency of the power amplifier in the first chip, or an impedance matching circuit consisting of passive devices for the impedance matching at the output and/or input of the power amplifier in the first chip.

In implementation, the second chip described above contains a compound semiconductor MMIC.

In implementation, the second chip described above contains a Si complementary metal-oxide-semiconductor (CMOS) integrated circuit.

In implementation, the second chip described above contains at least one passive device integrated on a substrate made of Si, GaAs, or glass.

In implementation, the second chip described above contains a filter.

The present invention will be understood more fully by reference to the detailed description of the drawings and the preferred embodiments below.

DETAILED DESCRIPTIONS OF PREFERRED EMBODIMENTS

Figure 24:
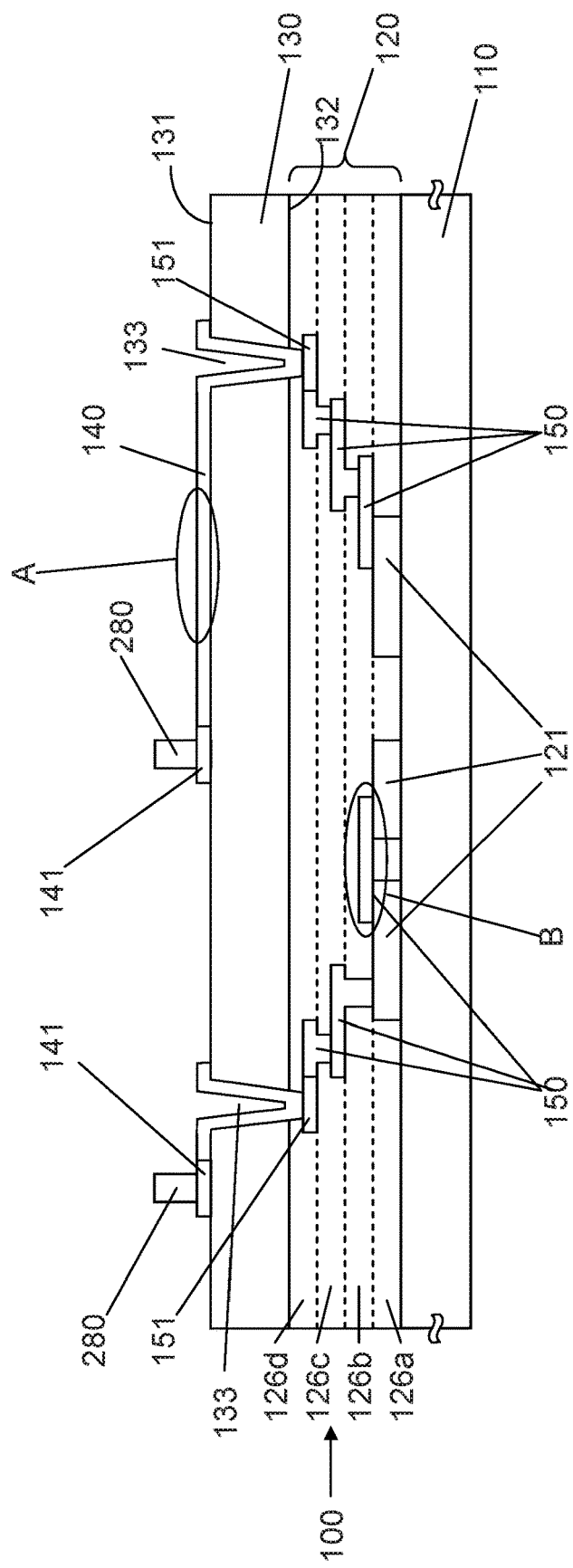
FIG. 24 is a schematic showing the cross-sectional view of an embodiment of a chip containing a compound semiconductor integrated circuit according to the present invention.
Figure 24A:
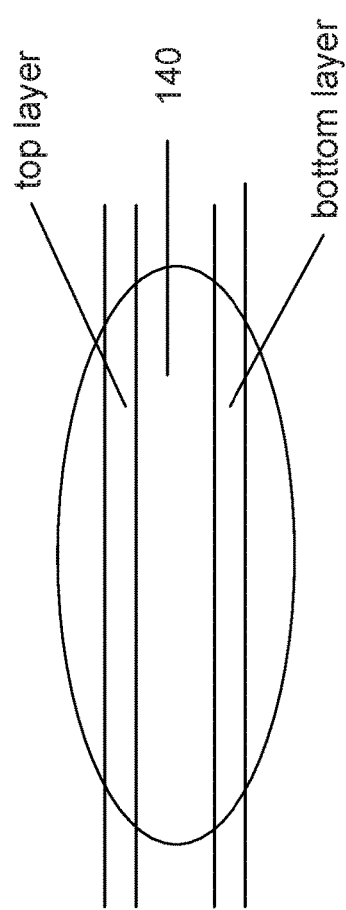
FIGS. 24A and 24B are a schematic showing the cross-sectional view of embodiments of the metal layers according to the present invention.
Figure 24B:
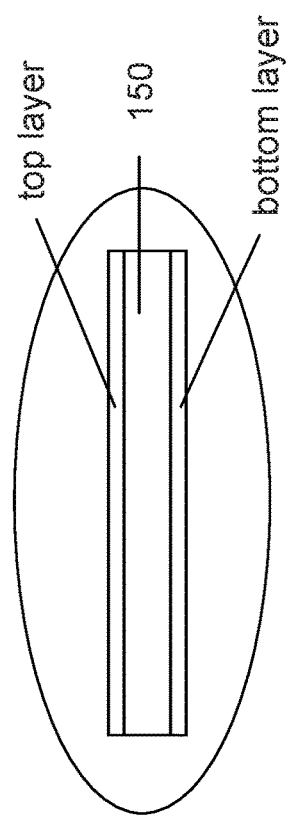

FIG. 24 is a schematic showing the cross-sectional view of an embodiment of semiconductor integrated circuit according to the present invention. The semiconductor integrated circuit comprises a first chip 100, which contains a compound semiconductor integrated circuit. The first chip comprises a substrate 110, a dielectric layer 130, an electronic device layer 120, and a first metal layer 140. The dielectric layer 130 is formed above the substrate 110 and has at least one dielectric layer via hole 133 penetrating from a first surface of the dielectric layer 131 to a second surface of the dielectric layer 132. The electronic device layer 120 is formed between the substrate 110 and the dielectric layer 130. The electronic device layer 120 contains at least one compound semiconductor electronic device 121 and at least one second metal layer 150. The first metal layer 140 forms at least one first pad 141 on the first surface of the dielectric layer 131 and extends into one dielectric layer via hole 133. At least one of the at least one second metal layer 150 is electrically in contact with the at least one semiconductor electronic device 121. At least one of the at least one second metal layer 150 also forms at least one second pad 151 placed at the end of one dielectric layer via hole 133 at the second surface of the dielectric layer 132, at which the at least one second pad 151 is electrically connected to the first metal layer 140 that extends into the dielectric layer via hole 133. As shown in FIGS. 24A and 24B, one or more bottom layers may be included below the first/second metal layer as an adhesion layer, a diffusion barrier layer, and/or a seed layer for electroplating. One or more top layers may be included above the first/second metal layer for protecting the metal layers from moisture and oxidation, and/or for better adhesion with a material formed on top. The bottom layer for a Cu layer can be made of Ti, TiW, Pd, etc., and the top layer for a Cu layer can be made of Au, etc. The bottom layer for a Au layer can be made of Ti, Pd, etc., and the top layer for a Au layer can be made of Ti, etc. By forming metal bumps 280 on the first pads 141, the first chip 100 may be connected to other electronic circuits. Connection to other circuits may also be made by bonding metal wires on the first pads 141 instead of using the metal bumps 280. For example, the first chip 100 may be mounted directly on a module substrate with the electrical connection made by bump bonding or wire bonding between the first pad 141 and a pad formed on the module substrate. At least one first pad 141 is electrically connected to the second pad 151 at the other end of the dielectric layer via hole 133 by the first metal layer 140 that extends in a three-dimensional manner over at least one of the at least one electronic device 121 in the electronic device layer 120 to place the at least one first pad 141 at a location favorable for connecting to the other electronic circuits.

The semiconductor integrated circuit shown in FIG. 24 is fabricated by the process as follows:

First, at least one compound semiconductor epitaxial layers is grown on the substrate 110. Using the at least one compound semiconductor epitaxial layer, at least one compound semiconductor electronic device (shown as at least one of the at least one electronic device 121 in FIG. 24) is fabricated on the substrate 110. At least one second metal layer 150 made essentially of Au is deposited above the at least one compound semiconductor epitaxial layer to form an electrical connection to at least one of the at least one compound semiconductor electronic device 121, and also to form at least one second pad 151. In FIG. 24, at least one second metal layer 150 is made of three metal layers stacked one after another isolated by dielectric passivation/protection layers 126a-126d preferably made of SiN. In particular, the topmost passivation/protection layer 126d covering the topmost at least one second metal layer 150 is SiN. SiN has strong ability as a diffusion barrier against foreign elements and for moisture protection. The process of fabricating electronic device layer 120 is thus completed by protecting its surface by SiN. Dielectric layer 130 is then deposited above electronic device layer 120, and at least one dielectric layer via hole 133 penetrating through dielectric layer 130 for electrical connection to at least one second pad 151 is formed. If a photosensitive material such as polybenzoxazole (PBO) is used for dielectric layer 130, at least one dielectric layer via hole 133 can be photo-patterned in the whole film formation process. The hole in the topmost SiN layer at the bottom of at least one dielectric layer via hole 133 can be made either before the deposition of dielectric layer 130 or after the formation of at least one dielectric layer via hole 133. First metal layer 140 made essentially of Cu is then deposited on dielectric layer 130 forming at least one first pad 141 on dielectric layer 130. First metal layer 140 extends from the each first pad 141 into at least one dielectric layer via hole 133 and connecting to at least one second pad 151. Here, first metal layer 140 is formed in such a way that it extends from at least one of the at least one first pad 141 three-dimensionally over at least one of the at least one compound semiconductor device (shown by 121 in FIG. 24), then into at least one dielectric layer via hole 133 and connects to at least one second pad 151.

In the fabrication method described above, electronic device layer 120 is formed as a front-end process made on substrate 110. The topmost surface is protected by SiN. The process containing Cu, on the other hand, is made on the surface protected by SiN. In this way, the contamination of compound semiconductor device by Cu is prevented.

Figure 25:
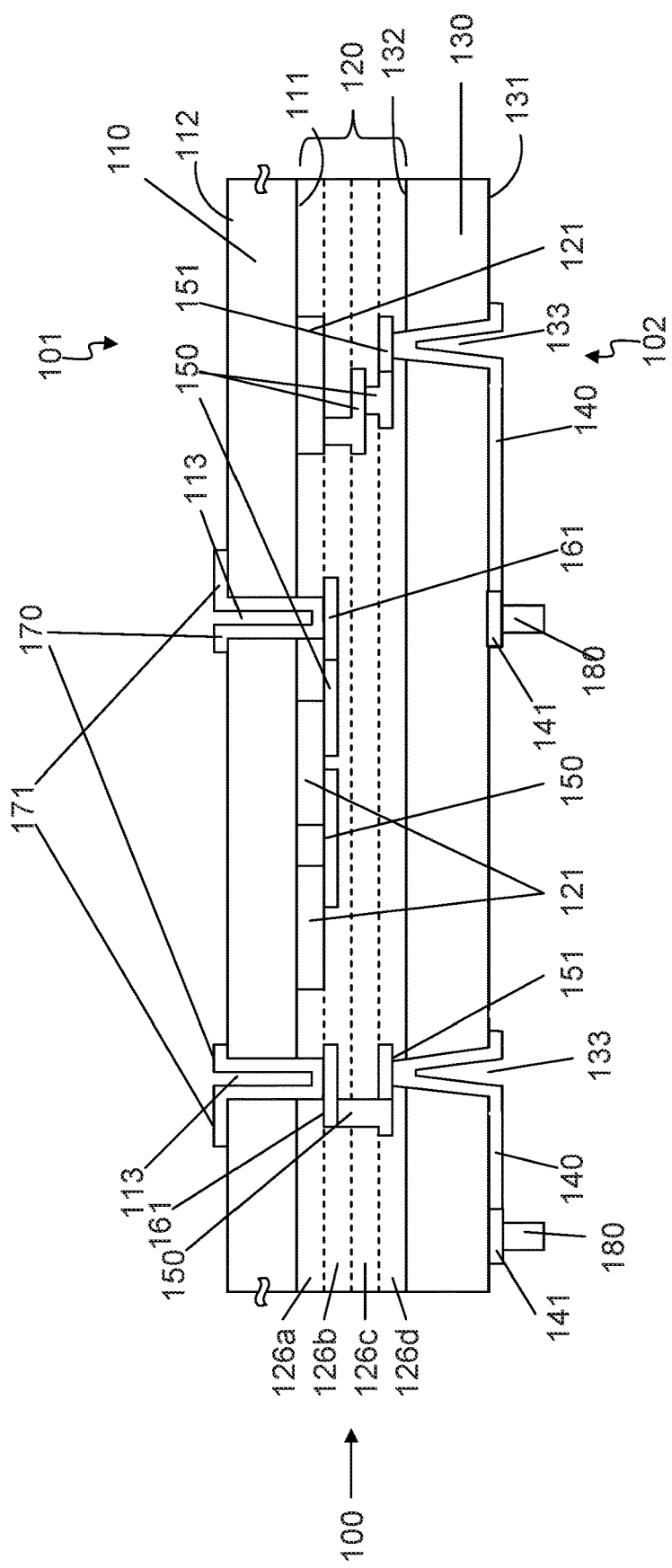
FIG. 25 is a schematic showing the cross-sectional view of another embodiment of a chip containing a compound semiconductor integrated circuit according to the present invention.

The semiconductor integrated circuit shown in FIG. 25 is fabricated by the process as follows:

First, at least one compound semiconductor epitaxial layers is grown on substrate 110. Using the at least one compound semiconductor epitaxial layer, at least one compound semiconductor electronic device (shown as at least one of the at least one electronic device 121 in FIG. 25) is fabricated on substrate 110. At least one second metal layer 150 made essentially of Au is deposited above the at least one compound semiconductor epitaxial layer to form an electrical connection to at least one of the at least one compound semiconductor electronic device 121, and also to form at least one second pad 151 and at least one third pad 161. In FIG. 25, at least one second metal layer 150 is made of three metal layers stacked one after another isolated by dielectric passivation/protection layers 126a-126d preferably made of SiN. In particular, the topmost passivation/protection layer 126d covering the topmost at least one second metal layer 150 is SiN. SiN has strong ability as a diffusion barrier against foreign elements and for moisture protection. The process of fabricating electronic device layer 120 is thus completed by protecting its surface by SiN. Dielectric layer 130 is then deposited above electronic device layer 120, and at least one dielectric layer via hole 133 penetrating through dielectric layer 130 for electrical connection to at least one second pad 151 is formed. If a photosensitive material such as polybenzoxazole (PBO) is used for dielectric layer 130, at least one dielectric layer via hole 133 can be photo-patterned in the whole film formation process. The hole in the topmost SiN layer at the bottom of at least one dielectric layer via hole 133 can be made either before the deposition of dielectric layer 130 or after the formation of at least one dielectric layer via hole 133. First metal layer 140 made essentially of Cu is then deposited on dielectric layer 130 forming at least one first pad 141 on dielectric layer 130. First metal layer 140 extends from the each first pad 141 into at least one dielectric layer via hole 133 and connecting to at least one second pad 151. Here, first metal layer 140 is formed in such a way that it extends from at least one of the at least one first pad 141 three-dimensionally over at least one of the at least one compound semiconductor device (shown by 121 in FIG. 25), then into at least one dielectric layer via hole 133 and connects to at least one second pad 151.

The process above made on the front surface is then followed by the backside process. First, substrate 110 is thinned down to a designed thickness by grinding, and at least one through substrate via hole 113 is formed to reach at least one third pad 161. Third metal layer 170 made preferably of Cu is then deposited on the backside of substrate 110 and forms at least one fourth pad 171. Third metal layer 170 also extends from at least one fourth pad 171 into at least one through substrate via hole 113, then connects to at least one third pad 161.

In the fabrication method described above, electronic device layer 120 is formed as a front-end process made on substrate 110. The topmost surface is protected by SiN. The process containing Cu, on the other hand, is made on the surface protected by SiN. In this way, the contamination of compound semiconductor device by Cu is prevented.

Figure 26:
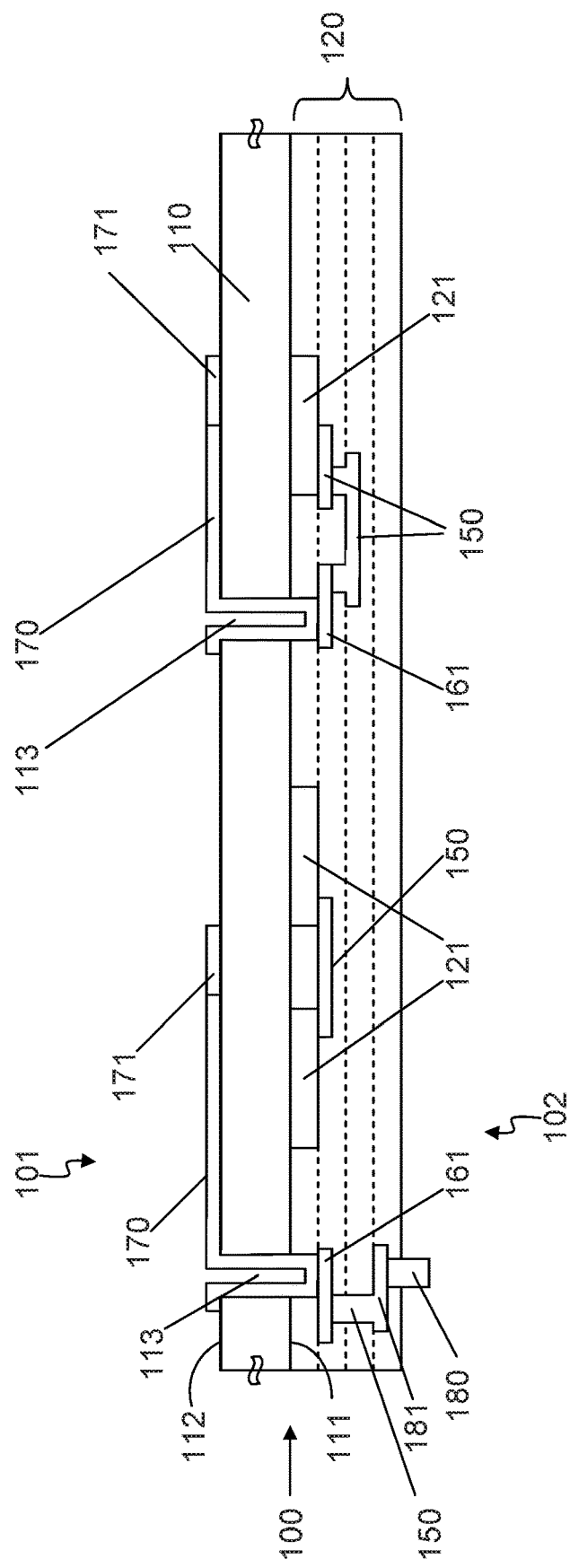
FIG. 26 is a schematic showing the cross-sectional view of another embodiment of a chip containing a compound semiconductor integrated circuit according to the present invention.

The semiconductor integrated circuit shown in FIG. 26 is fabricated by the process as follows:

First, at least one compound semiconductor epitaxial layers is grown on substrate 110. Using the at least one compound semiconductor epitaxial layer, at least one compound semiconductor electronic device (shown as at least one of the at least one electronic device 121 in FIG. 26) is fabricated on substrate 110. At least one second metal layer 150 made essentially of Au is deposited above the at least one compound semiconductor epitaxial layer to form an electrical connection to at least one of the at least one compound semiconductor electronic device 121, and also to form at least one third pad 161. In FIG. 26, at least one second metal layer 150 is made of three metal layers stacked one after another isolated by dielectric passivation/protection layers preferably made of SiN.

The process above made on the front surface is then followed by the backside process. First, substrate 110 is thinned down to a designed thickness by grinding, and at least one through substrate via hole 113 is formed. Third metal layer 170 made essentially of Cu is then deposited on the backside of substrate 110 and forms at least one fourth pad 171. Third metal layer 170 also extends from at least one fourth pad 171 into at least one through substrate via hole 113, then connects to at least one third pad 161. Here, third metal layer 170 is formed in such a way that it extends from at least one of the at least one fourth pad 171 three-dimensionally over at least one of the at least one compound semiconductor device (shown by 121 in FIG. 26), then into at least one through substrate via hole 113 and connects to at least one third pad 161.

In the fabrication method described above, electronic device layer 120 is formed as a front-end process made on substrate 110. The process containing Cu, on the other hand, is made on the backside of the substrate 110. In this way, the contamination of compound semiconductor device by Cu is prevented. The use of Cu for third metal layer 170 reduces the signal loss due to the electrical connection between the main compound semiconductor integrated circuit and the second chip.

Figure 1:
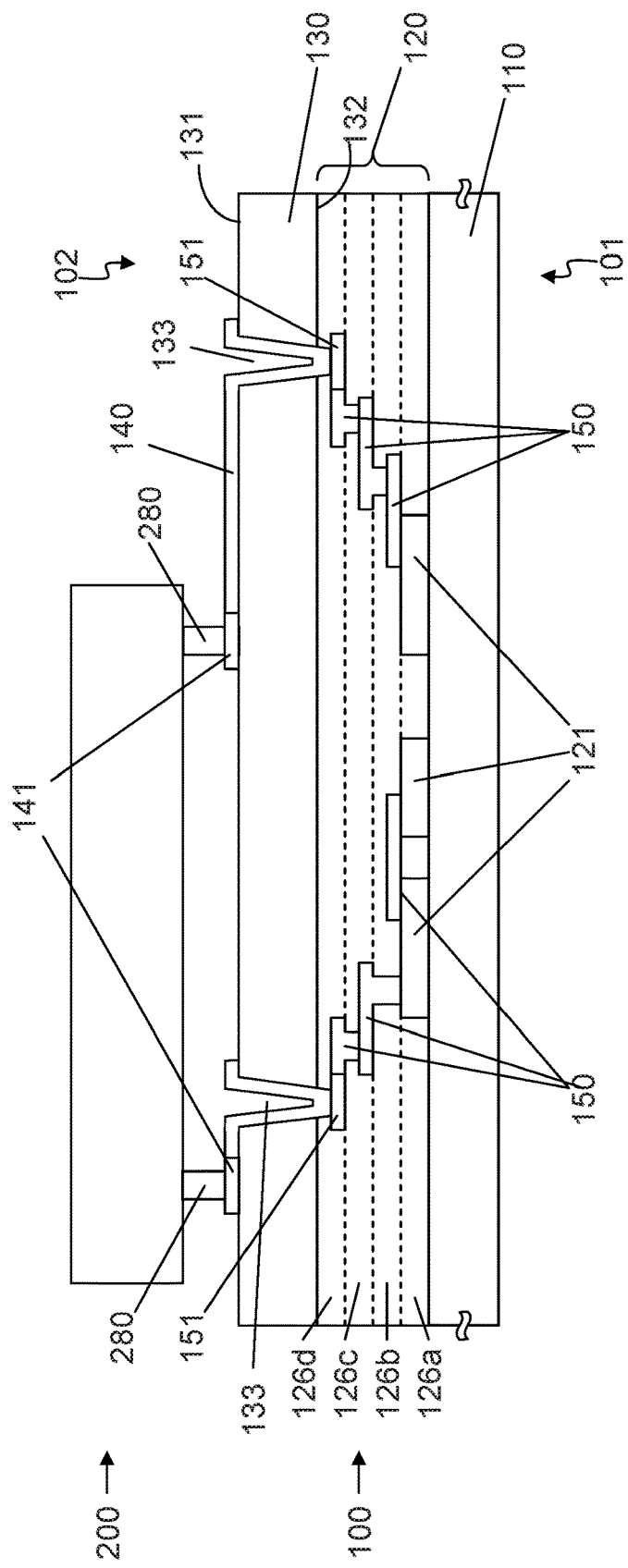
FIG. 1 is a schematic showing the cross-sectional view of an embodiment according to the present invention, in which the second chip is stacked on the front surface of the first chip.

FIG. 1 is a schematic showing the cross-sectional view of an embodiment of a semiconductor integrated circuit according to the present invention. The semiconductor integrated circuit comprises the aforementioned first chip 100 and a second chip 200. The second chip 200 contains an electronic circuit. The first surface of the dielectric layer of the first chip 100 defines the front surface 102 of the first chip, and the surface of the substrate of the first chip 100 opposite to the dielectric layer defines the back surface 101 of the first chip. The second chip 200 is stacked on the front surface 102 of the first chip 100 and electrically connects to the at least one first pad 141 via bumps 280. The stacked first chip and the second chip are thus electrically connected and integrated into one circuit. To align the electrical connection between the first chip 100 and the second chip 200 by the bumps 280, the first pad 141 is electrically connected to the second pad 151 at the other end of the dielectric layer via hole 133 by the first metal layer 140 that extends in a three-dimensional manner over the at least one of the at least one electronic device 121 in the electronic device layer 120.

The semiconductor integrated circuit shown in FIG. 1 is fabricated by the process as follows:

First, at least one compound semiconductor epitaxial layers is grown on the substrate 110. Using the at least one compound semiconductor epitaxial layer, at least one compound semiconductor electronic device (shown as at least one of the at least one electronic device 121 in FIG. 1) is fabricated on the substrate 110. At least one second metal layer 150 made essentially of Au is deposited above the at least one compound semiconductor epitaxial layer to form an electrical connection to at least one of the at least one compound semiconductor electronic device 121, and also to form at least one second pad 151. In FIG. 1, at least one second metal layer 150 is made of three metal layers stacked one after another isolated by dielectric passivation/protection layers 126a-126d preferably made of SiN. In particular, the topmost passivation/protection layer 126d covering the topmost at least one second metal layer 150 is SiN. SiN has strong ability as a diffusion barrier against foreign elements and for moisture protection. The process of fabricating electronic device layer 120 is thus completed by protecting its surface by SiN. Dielectric layer 130 is then deposited above electronic device layer 120, and at least one dielectric layer via hole 133 penetrating through dielectric layer 130 for electrical connection to at least one second pad 151 is formed. If a photosensitive material such as polybenzoxazole (PBO) is used for dielectric layer 130, at least one dielectric layer via hole 133 can be photo-patterned in the whole film formation process. The hole in the topmost SiN layer at the bottom of at least one dielectric layer via hole 133 can be made either before the deposition of dielectric layer 130 or after the formation of at least one dielectric layer via hole 133. First metal layer 140 made essentially of Cu is then deposited on dielectric layer 130 forming at least one first pad 141 on dielectric layer 130. First metal layer 140 extends from the each first pad 141 into at least one dielectric layer via hole 133 and connecting to at least one second pad 151. Here, first metal layer 140 is formed in such a way that it extends from at least one of the at least one first pad 141 three-dimensionally over at least one of the at least one compound semiconductor device (shown by 121 in FIG. 1), then into at least one dielectric layer via hole 133 and connects to at least one second pad 151.

The process steps above describe the essential part of the fabrication of first chip 100. Second chip 200 is then stacked on front surface 102 of first chip 100. The electronic circuit in second chip 200 is electrically connected to at least one of the at least one first pad 141. Thus, the electronic circuit in second chip 200 is connected to the semiconductor integrated circuit in first chip 100. The connection is made via bumps 280. Bumps 280 are formed beforehand either on chip 100 or chip 200.

In the fabrication method described above, electronic device layer 120 is formed as a front-end process made on substrate 110. The topmost surface is protected by SiN. The process containing Cu, on the other hand, is made on the surface protected by SiN. In this way, the contamination of compound semiconductor device by Cu is prevented.

Figure 2:
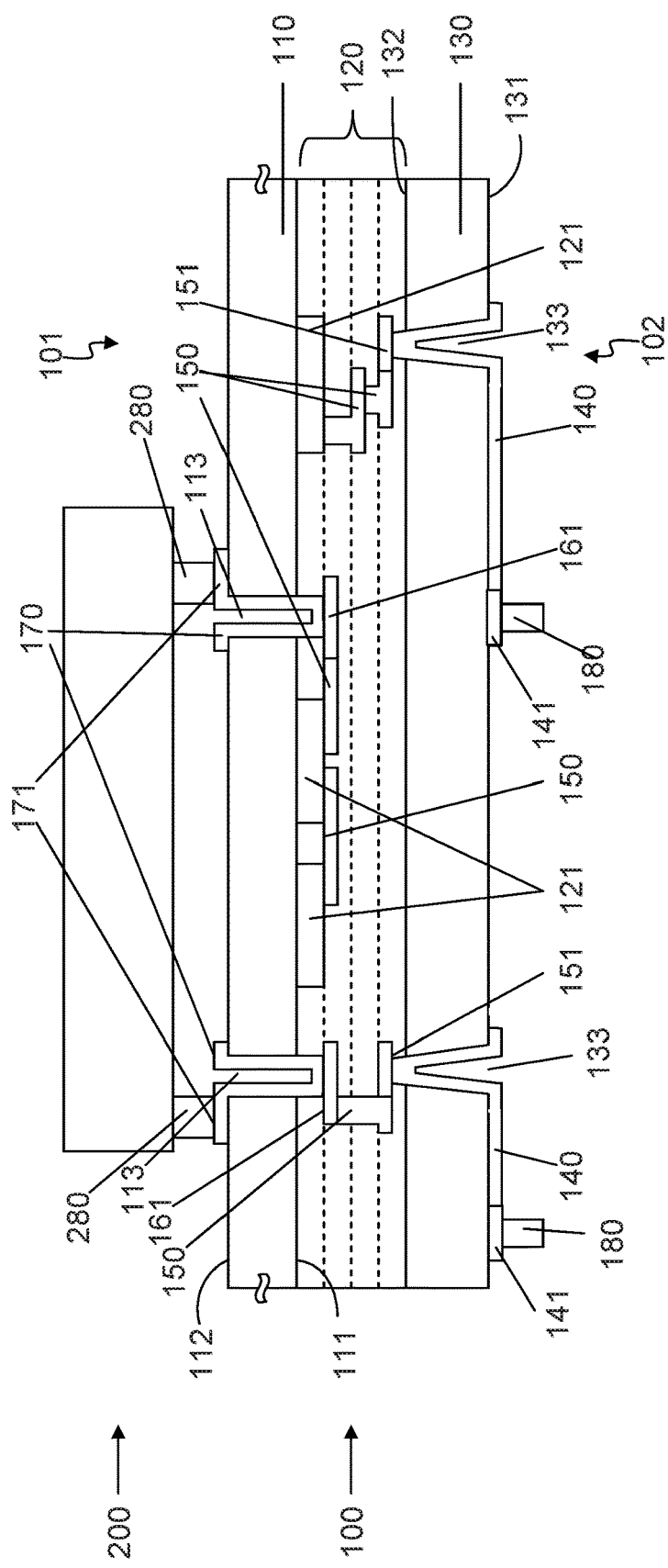
FIG. 2 is a schematic showing the cross-sectional view of an embodiment according to the present invention, in which the second chip is stacked on the back surface of the first chip.

FIG. 2 is a schematic showing the cross-sectional view of another embodiment of the semiconductor integrated circuit according to the present invention. The semiconductor integrated circuit comprises a first chip 100 and a second chip 200, in which the first chip 100 contains a compound semiconductor integrated circuit and the second chip 200 contains an electronic circuit. The first chip 100 comprises a substrate 110, an electronic device layer 120, a dielectric layer 130, a first metal layer 140, and a third metal layer 170.

The substrate 110 has at least one through substrate via hole 113 penetrating from a front side of the substrate 111 to a backside of the substrate 112. The dielectric layer 130 is formed above the front side of the substrate 111 and has at least one dielectric layer via hole 133 penetrating from a first surface of the dielectric layer 131 to a second surface of the dielectric layer 132. The electronic device layer 120 contains at least one electronic device including at least one compound semiconductor electronic device 121 and at least one second metal layer 150, and is formed between the substrate 110 and the dielectric layer 130. The at least one first metal layer 140 is made essentially of Cu. The first metal layer 140 forms at least one first pad 141 on the first surface of the dielectric layer 131 and extends into one dielectric layer via hole 133. At least one of the at least one second metal layer 150 is electrically in contact with the at least one compound semiconductor electronic device 121. All of the at least one second metal layer 150 in contact with the at least one compound semiconductor electronic device 121 is made essentially of Au. One of the at least one second metal layer also forms a second pad 151 placed at the end of the dielectric layer via hole 133 opposite to the first pad 141, at which the second pad 151 is electrically connected to the first metal layer 140 that extends into the dielectric layer via hole 133. The third metal layer 170 forms at least one fourth pad 171 on the backside of the substrate 112 and extends into one through substrate via hole 113. At least one of the at least one second metal layer 150 forms at least one third pad 161 at the end of one through substrate via holes opposite to the fourth pad 171, at which the third pad 161 is electrically connected to the third metal layer 170 that extends into the through substrate via hole 113. One or more bottom layers may be included below the first/second/third metal layer, and/or one or more top layers may be included above the first/second/third metal layer, as described previously. The first surface of the dielectric layer defines the front surface 102 of the first chip 100, and the backside of the substrate defines the back surface 101 of the first chip 100. In this embodiment, the first chip 100 is turned over and the second chip 200 is stacked on the back surface 101 of the first chip 100 and electrically connects to the at least one fourth pad 171 via bumps 280. The stacked first chip and the second chip are thus electrically connected and integrated into one circuit. Each of the at least one first pad 141 is further connected to a bump 180 for the electrical connection to other circuit chips or electronic modules. To align the electrical connection between the first chip 100 and the second chip 200 by the bumps 280, the first pad 141 is electrically connected to the second pad 151 at the other end of the dielectric layer via hole 133 by the first metal layer 140 that extends in a three-dimensional manner over at least one of the at least one electronic device 121 in the electronic device layer 120.

The semiconductor integrated circuit shown in FIG. 2 is fabricated by the process as follows:

First, at least one compound semiconductor epitaxial layers is grown on substrate 110. Using the at least one compound semiconductor epitaxial layer, at least one compound semiconductor electronic device (shown as at least one of the at least one electronic device 121 in FIG. 2) is fabricated on substrate 110. At least one second metal layer 150 made essentially of Au is deposited above the at least one compound semiconductor epitaxial layer to form an electrical connection to at least one of the at least one compound semiconductor electronic device 121, and also to form at least one second pad 151 and at least one third pad 161. In FIG. 2, at least one second metal layer 150 is made of three metal layers stacked one after another isolated by dielectric passivation/protection layers preferably made of SiN. In particular, the topmost passivation/protection layer covering the topmost at least one second metal layer 150 is SiN. SiN has strong ability as a diffusion barrier against foreign elements and for moisture protection. The process of fabricating electronic device layer 120 is thus completed by protecting its surface by SiN. Dielectric layer 130 is then deposited above electronic device layer 120, and at least one dielectric layer via hole 133 penetrating through dielectric layer 130 for electrical connection to at least one second pad 151 is formed. If a photosensitive material such as polybenzoxazole (PBO) is used for dielectric layer 130, at least one dielectric layer via hole 133 can be photo-patterned in the whole film formation process. The hole in the topmost SiN layer at the bottom of at least one dielectric layer via hole 133 can be made either before the deposition of dielectric layer 130 or after the formation of at least one dielectric layer via hole 133. First metal layer 140 made essentially of Cu is then deposited on dielectric layer 130 forming at least one first pad 141 on dielectric layer 130. First metal layer 140 extends from the each first pad 141 into at least one dielectric layer via hole 133 and connecting to at least one second pad 151. Here, first metal layer 140 is formed in such a way that it extends from at least one of the at least one first pad 141 three-dimensionally over at least one of the at least one compound semiconductor device (shown by 121 in FIG. 2), then into at least one dielectric layer via hole 133 and connects to at least one second pad 151.

The process above made on the front surface is then followed by the backside process. First, substrate 110 is thinned down to a designed thickness by grinding, and at least one through substrate via hole 113 is formed to reach at least one third pad 161. Third metal layer 170 is then deposited on the backside of substrate 110 and forms at least one fourth pad 171. Third metal layer 170 also extends from at least one fourth pad 171 into at least one through substrate via hole 113, then connects to at least one third pad 161.

The process steps above describe the essential part of the fabrication of first chip 100. Second chip 200 is then stacked on back surface 101 of first chip 100. The electronic circuit in second chip 200 is electrically connected to at least one of the at least one fourth pad 171. Thus, the electronic circuit in second chip 200 is connected to the semiconductor integrated circuit in first chip 100. The connection is made via bumps 280. Bumps 280 are formed beforehand either on chip 100 or chip 200.

In the fabrication method described above, electronic device layer 120 is formed as a front-end process made on substrate 110. The topmost surface is protected by SiN. The process containing Cu, on the other hand, is made on the surface protected by SiN. In this way, the contamination of compound semiconductor device by Cu is prevented.

Figure 3:
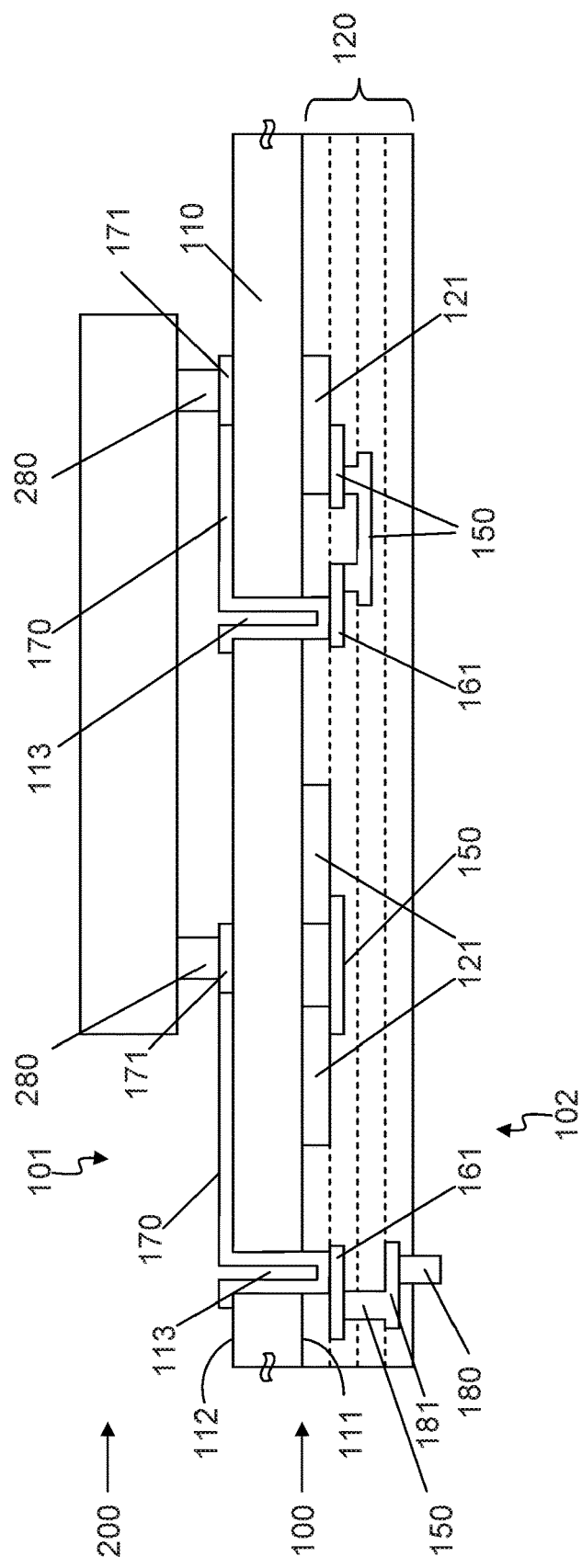
FIG. 3 is a schematic showing the cross-sectional view of another embodiment according to the present invention, in which the second chip is stacked on the back surface of the first chip.

FIG. 3 is a schematic showing the cross-sectional view of another embodiment of the semiconductor integrated circuit according to the present invention. The semiconductor integrated circuit comprises a first chip 100 and a second chip 200, in which the first chip 100 contains a compound semiconductor integrated circuit and the second chip 200 contains an electronic circuit. The first chip 100 comprises a substrate 110, an electronic device layer 120, and a third metal layer 170. The substrate 110 has at least one through substrate via hole 113 penetrating from a front side of the substrate 111 to a backside of the substrate 112. The electronic device layer 120 is formed on the front side of the substrate 111 and contains at least one electronic device 121 and at least one second metal layer 150. The third metal layer 170 forms at least one fourth pad 171 on the backside of the substrate 112 and extends into the through substrate via hole 113. At least one of the at least one second metal layer 150 forms a third pad 161 at the end of one through substrate via hole 113 opposite to the fourth pad 171, at which the third pad 161 is electrically connected to the third metal layer 170 that extend into the through substrate via hole 113. The third pad 161 is electrically connected, directly or indirectly, by the at least one second metal layer 150 to at least one of the at least one electronic device 121 or a fifth pad 181 formed by the at least one second metal layer 150 and placed at or in the vicinity of the surface of the electronic device layer 120 opposite to the substrate 110. One or more bottom layers may be included below the second/third metal layer, and/or one or more top layers may be included above the second/third metal layer, as described previously. The surface of the electronic device layer opposite to the substrate defines the front surface 102 of the first chip, and the backside of the substrate defines the back surface 101 of the first chip. In this embodiment, the first chip 100 is disposed up side down. The second chip 200 is stacked on the back surface 101 of the overturned first chip 100 and electrically connected to the at least one fourth pad 171 via bumps 280. The stacked first chip and the second chip are thus electrically connected and integrated into one circuit. The fifth pad 181 in the vicinity of the front surface 102 is connected to a bump 180 for further connected to other circuit chips or electronic modules. To align the electrical connection between the first chip 100 and the second chip 200, the fourth pad 171 is electrically connected to the third pad 161 at the other end of the through substrate via hole 113 by the third metal layer 170 that extends in a three-dimensional manner over one of the at least one electronic device 121 in the electronic device layer 120.

The semiconductor integrated circuit shown in FIG. 3 is fabricated by the process as follows:

First, at least one compound semiconductor epitaxial layers is grown on substrate 110. Using the at least one compound semiconductor epitaxial layer, at least one compound semiconductor electronic device (shown as at least one of the at least one electronic device 121 in FIG. 3) is fabricated on substrate 110. At least one second metal layer 150 made essentially of Au is deposited above the at least one compound semiconductor epitaxial layer to form an electrical connection to at least one of the at least one compound semiconductor electronic device 121, and also to form at least one third pad 161. In FIG. 2, at least one second metal layer 150 is made of three metal layers stacked one after another isolated by dielectric passivation/protection layers preferably made of SiN.

The process above made on the front surface is then followed by the backside process. First, substrate 110 is thinned down to a designed thickness by grinding, and at least one through substrate via hole 113 is formed. Third metal layer 170 is then deposited on the backside of substrate 110 and forms at least one fourth pad 171. Third metal layer 170 also extends from at least one fourth pad 171 into at least one through substrate via hole 113, then connects to at least one third pad 161. Here, third metal layer 170 is formed in such a way that it extends from at least one of the at least one fourth pad 171 three-dimensionally over at least one of the at least one compound semiconductor device (shown by 121 in FIG. 3), then into at least one through substrate via hole 113 and connects to at least one third pad 161.

The process steps above describe the essential part of the fabrication of first chip 100. Second chip 200 is then stacked on back surface 101 of first chip 100. The electronic circuit in second chip 200 is electrically connected to at least one of the at least one fourth pad 171. Thus, the electronic circuit in second chip 200 is connected to the semiconductor integrated circuit in first chip 100. The connection is made via bumps 280. Bumps 280 are formed beforehand either on chip 100 or chip 200.

In the fabrication method described above, electronic device layer 120 is formed as a front-end process made on substrate 110. The process containing Cu, on the other hand, is made on the backside of the substrate 110. In this way, the contamination of compound semiconductor device by Cu is prevented. The use of Cu for third metal layer 170 reduces the signal loss due to the electrical connection between the main compound semiconductor integrated circuit and the second chip.

Figure 4:
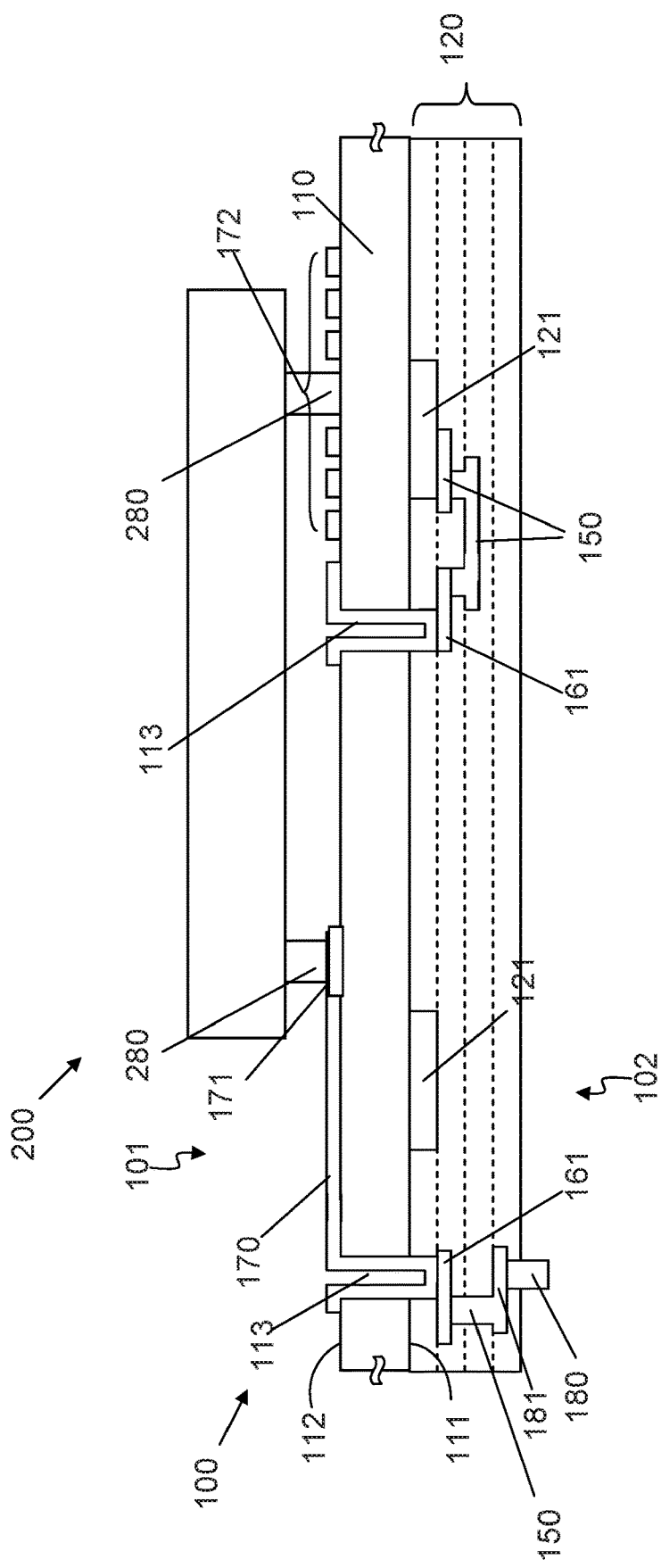
FIG. 4 is a schematic showing the cross-sectional view of another embodiment according to the present invention, in which an inductor is formed on the back surface of the first chip.

Each of the at least one fourth metal layer 170 in the previous embodiment may form a passive electronic element, such as an inductor. FIG. 4 is a schematic showing the cross-sectional view of another embodiment of the semiconductor integrated circuit, in which the fourth metal layer 170 forms an inductor 172 on the backside of the substrate 112. The inductor 172 is formed in a three-dimensional manner over one of the electronic devices 121, and the inductor is electrically connected to the first chip. The inductor may also connect to the second chip, or both the first chip and the second chip.

In the aforementioned embodiments, the first chip must be a compound semiconductor integrated circuit chip, and the second chip can be a compound semiconductor, a semiconductor, or other types of electronic integrated circuit chip. The substrate of the first chip is made of GaAs, Si, SiC, sapphire, or GaN. The substrate of the second chip is also made of GaAs, Si, SiC, sapphire, or GaN, when the second chip is a compound semiconductor integrated circuit chip. The dielectric layer of the first chip is made of dielectric materials, preferably of Polybenzoxazole (PBO). The preferable thickness of the dielectric layer is 10 μm or thicker for minimizing the influence of the first metal layer on the electrical characteristics of the electronic device in the electronic device layer, over which the first metal layer extends in a three-dimensional manner to connect to the second pad at the other end of the dielectric layer via hole. The electronic device layer is a composite layer including a compound semiconductor layer and a passivation layer. The passivation layer is made of dielectric materials, preferably of SiN, which can insulate and passivate the electronic devices. The compound semiconductor electronic device can be a heterojunction bipolar transistor (HBT) or a high electron mobility transistor (HEMT). The compound semiconductor electronic device can be a GaN field effect transistor (FET) as well. The metal layers for electrical connections in the first chip are divided into the metal layers in the electronic device layer and the metal layers not in the electronic device layer. All of the at least one second metal layer 150 directly in contact with the compound semiconductor electronic device are made essentially of Au and contain no or at least negligible amount of Cu to prevent the contamination of the compound semiconductor with Cu, or all of the at least one second metal layer in the electronic device layer may be made essentially of Au with no or negligible amount of Cu. In the latter way, the formation of the electronic device layer can be performed as a front-end process without a metal layer made essentially of Cu, thereby preventing the cross contamination of the front-end process by Cu. The degradation of circuit performance and reliability due to the contamination by Cu is thus prevented.

The metal layers which are not in the electronic device layer (the first metal layer 140 and the third metal layer 170) are not directly connected to the compound semiconductor electronic devices but via the metal layers in the electronic device layer, and therefore they can be made of Cu to reduce the manufacturing cost. The formation of the metal layer made of Cu can be performed as the back-end process, thereby preventing the contamination of the front-end process by Cu atoms. The thickness of the Cu layer in the first metal layer is preferably 3 μm or thicker.

Further embodiments provided by the present invention are described as follows:

Embodiment 1

Figure 5:
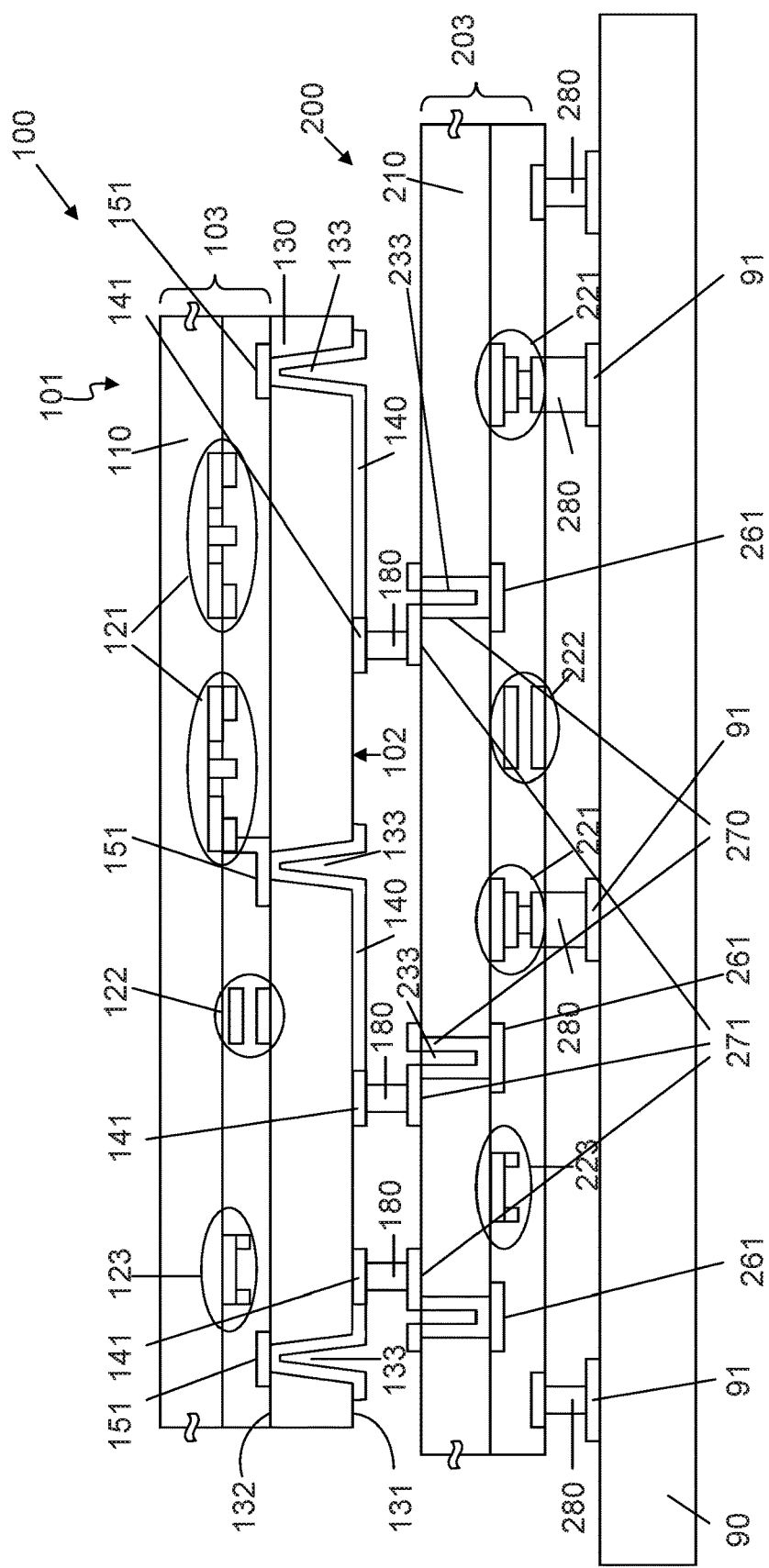
FIG. 5-23 are schematics showing the embodiment 1~19 provided by the present invention.

FIG. 5 is a schematic showing the cross-sectional view of another embodiment of the semiconductor integrated circuit according to the present invention, in which the first chip 100 contains an HEMT MMIC 103, and the second chip 200 contains an HBT power amplifier (PA) MMIC 203. The HEMT MMIC 103 has a substrate 110 made of GaAs. On the substrate 110 of the HEMT MMIC is an electronic device layer 120 consisting of bias control, switch, and logic circuits constructed by pseudomorphic HEMTs (pHEMTs) 121. The HEMT MMIC serves as a circuit to control the bias condition of the HBT PA and/or to control the RF signal path in the HBT PA. The electronic device layer 120 may contains one or more SiN layers for the insulation and passivation of the devices. On the HEMT MMIC, a dielectric layer 130 made of PBO is deposited on the surface as an insulating layer. The dielectric layer is spin coated to the thickness of about 10 μm. To provide electrical connection to the underlying MMIC, plural dielectric layer via holes 133 are formed in the dielectric layer 130 penetrating from a first surface of the dielectric layer 131 to a second surface of the dielectric layer 132 by a photolithography technique using the photosensitivity of PBO. On the dielectric layer 130, the first metal layer 140 made essentially of Cu with a thickness of around 5 μm are electroplated using sputtered TiW/Cu as a seed metal. The first metal layer 140 forms plural first pads 141 for the electrical connection with the HBT PA MMIC. The first metal layer 140 extends from the first pad 141 to a dielectric layer via hole 133 over the active region of the HEMT MMIC consisting of pHEMTs 121, capacitors 122, and resistors 123 in a three-dimensional manner to make it possible to form the electrical connection between two chips having the connection nodes apart from each other. The first metal layer 140 further extends into the dielectric layer via hole and connects to a second metal pad 151 formed at the end of the dielectric layer via hole opposite to the first pad 141. In this embodiment, all of the second metal layers are made essentially of Au. Therefore, the second metal pad 151 is also made essentially of Au. Each of the second metal pads 151 is further electrically connected through the second metal layers 150 to a pHEMT 121, a capacitor 122, or a resistor 123 in the HEMT MMIC. The direct contact of Cu with devices, particularly with the compound semiconductor devices, in the HEMT MMIC is avoided to prevent the degradation of the device by Cu atoms. Furthermore, since all of the second metal layers are made essentially of Au, the front-end process, which is essentially the formation of the electronic device layer, can be performed without a Cu process. The Cu process is separately done in the back-end process. The Cu cross contamination of devices in the electronic device layer is thus prevented, and the high stability and reliability in the circuit performance can be obtained. The second chip 200 is stacked on the front surface 102 of the first chip 100. For the connection between the two chips, a first bump 180 is formed on each of the first pad 141 of the HEMT MIMIC 103. The first bump 180 may be a Cu pillar with a SnAg solder at the top of it. The second chip 200 has a substrate 210 made of GaAs. Each of the first bump 180 is then connected to a contact pad 271 formed by a back side metal layer 270 on the backside of the substrate 210 of the second chip 200. Each of the contact pad 271 extends into a through substrate via hole 233 formed in the GaAs substrate 210 of the second chip, and then connects to a HBT 221, a capacitor 222, or a resistor 223 formed in the HBT PA MMIC. The stacked chips are turned over and the second chip 200 is flip-chip assembled with bumps 280, and connected to module pads 91 formed on a module substrate 90.

Embodiment 2

Figure 6:
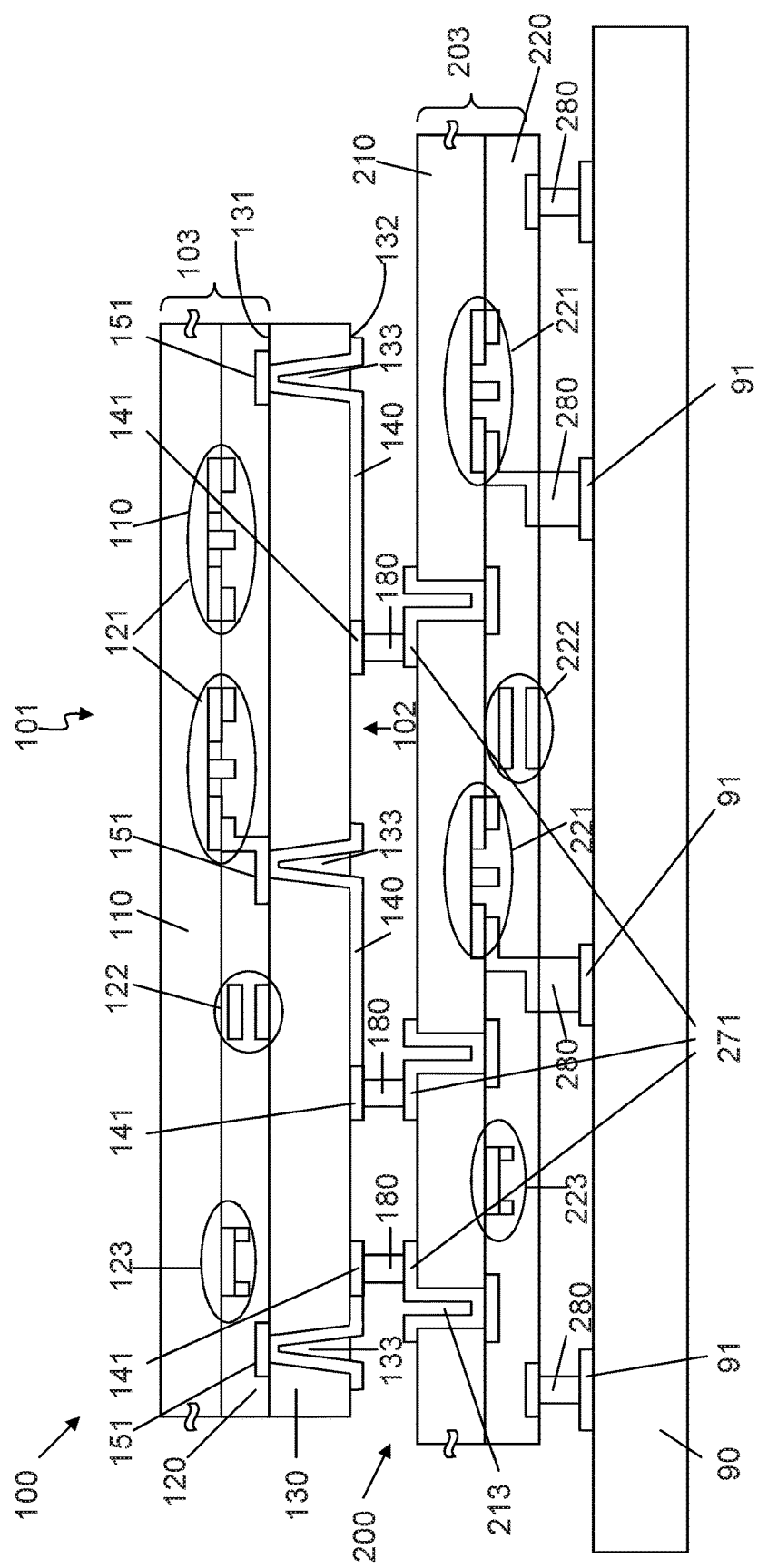

FIG. 6 is a schematic showing the cross-sectional view of another embodiment of the semiconductor integrated circuit according to the present invention, in which the first chip 100 contains a HEMT MMIC 103 and the second chip 200 contains an HEMT PA MMIC 203. The HEMT MIMIC 103 consists of bias control, switch, and logic circuits, and serves as a circuit to control the bias condition for the HEMT PA MIMIC 203 and/or to control the RF signal path in the HEMT PA MMIC 203. Other descriptions about the design of this embodiment are the same as that of the embodiment 1, except that the HBT PA MMIC of the second chip 200 is replaced by the HEMT PA MMIC.

Embodiment 3

Figure 7:
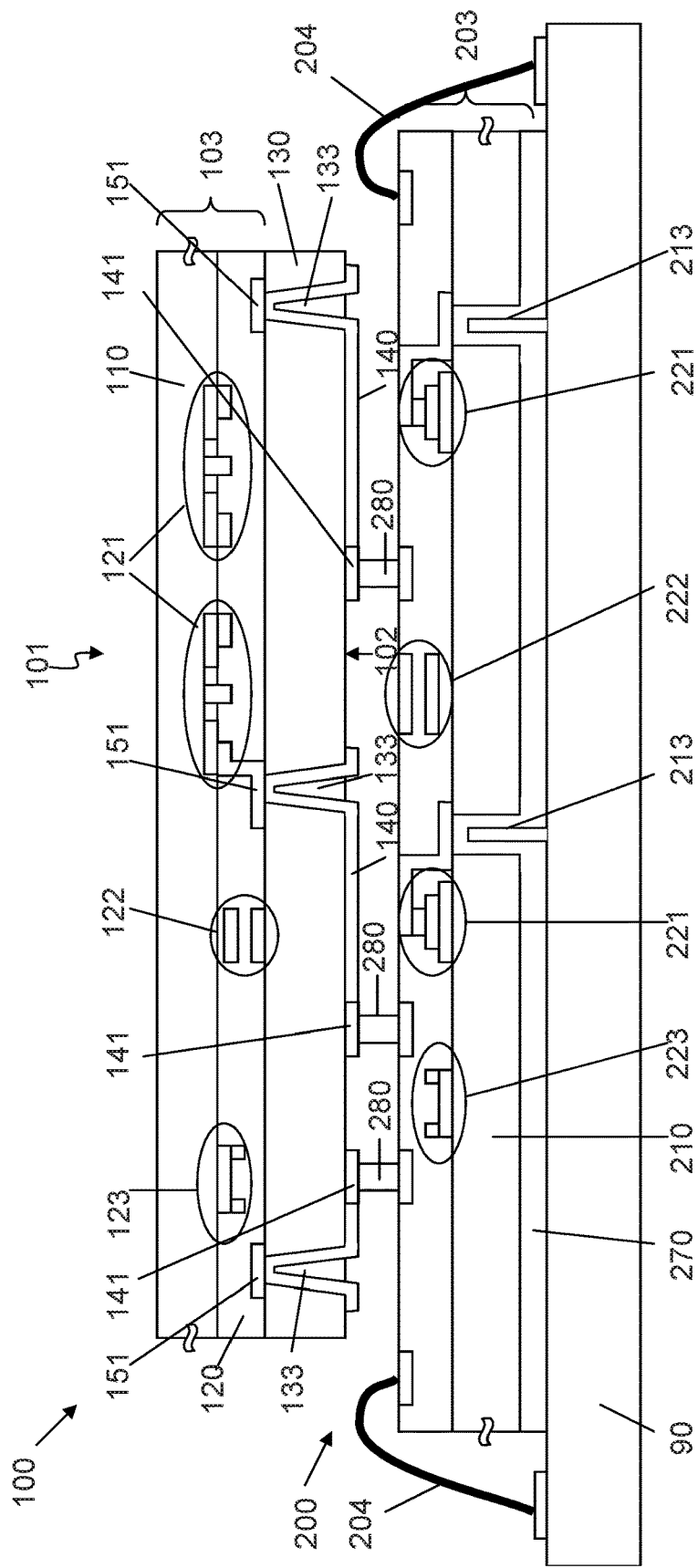

FIG. 7 is a schematic showing the cross-sectional view of another embodiment of the semiconductor integrated circuit according to the present invention, in which the first chip 100 contains an HEMT MMIC 103 and the second chip 200 contains an HBT PA MIMIC 203. The second chip 200 is stacked on the front surface 102 of the first chip 100 and the stacked chips are turned over and the second chip 200 is assembled on a module substrate 90 by wire bonding via bonding wires 204. Other descriptions about the design of this embodiment are the same as that of the embodiment 1

Embodiment 4

Figure 8:
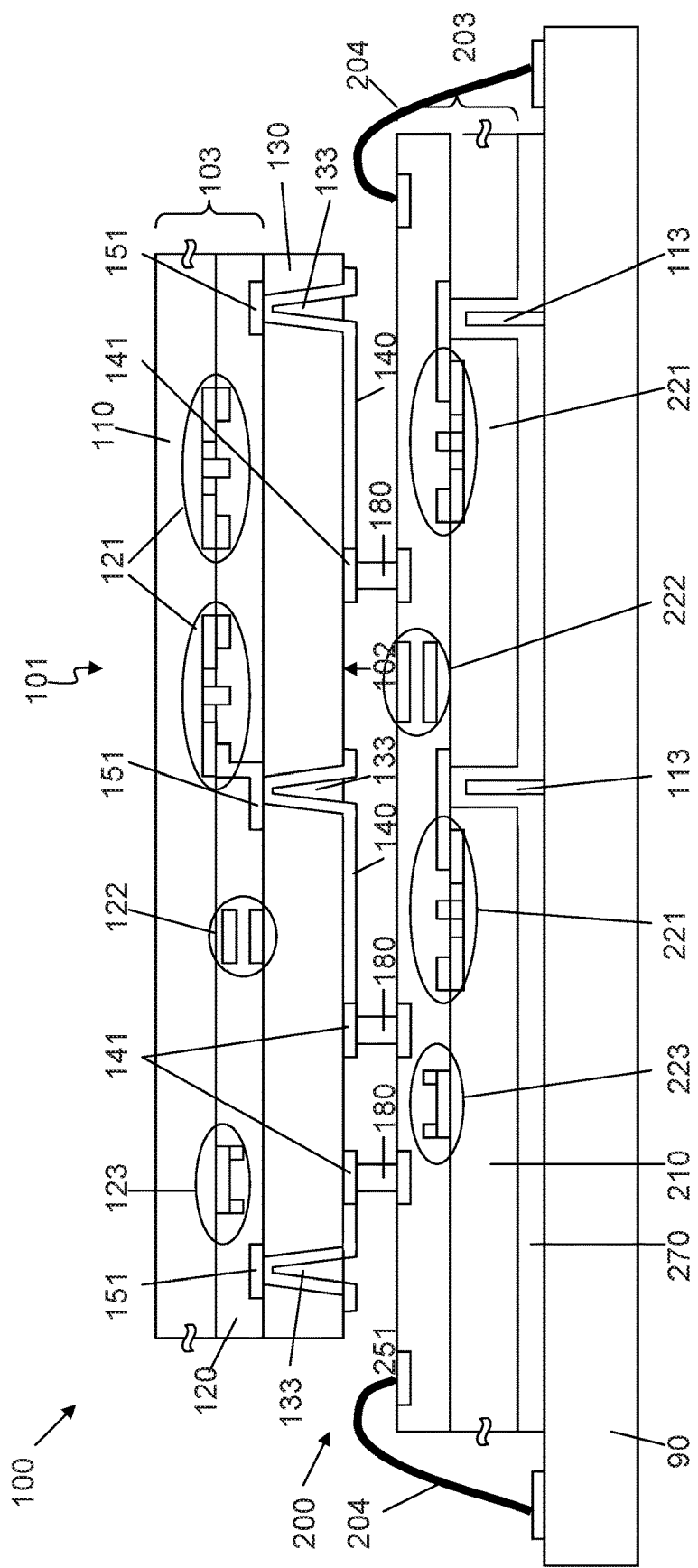

FIG. 8 is a schematic showing the cross-sectional view of another embodiment of the semiconductor integrated circuit according to the present invention, in which the first chip 100 contains a HEMT MMIC 103 and the second chip 200 contains another HEMT PA MIMIC 203. The second chip 200 is assembled on a module substrate 90 by wire bonding via bonding wires 204. Other descriptions about the design of this embodiment are same to that of the embodiment 3, except that the HBT PA MMIC of the second chip 200 is replaced by the HEMT PA MMIC.

Embodiment 5

Figure 9:
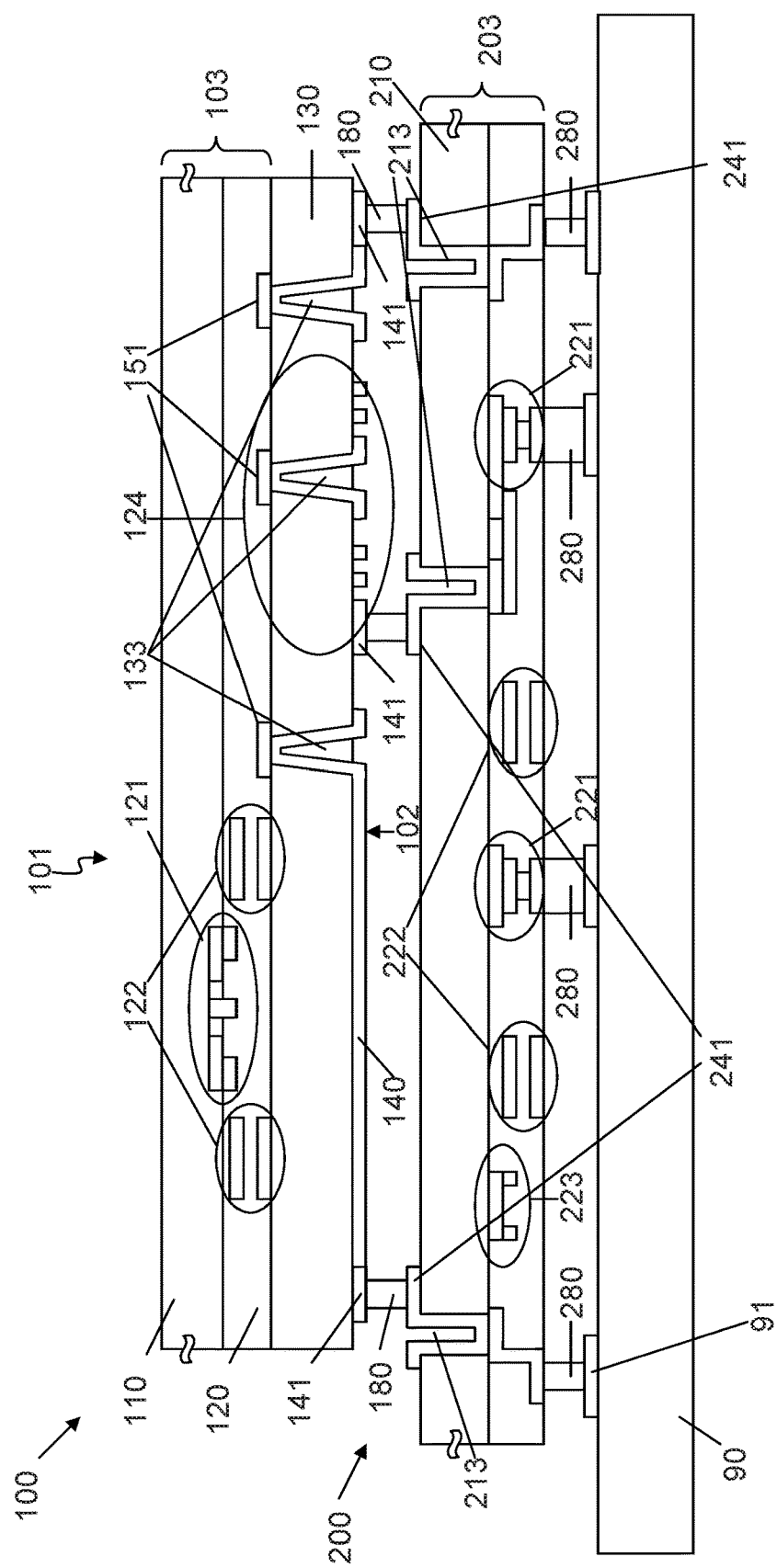

FIG. 9 is a schematic showing the cross-sectional view of another embodiment of the semiconductor integrated circuit according to the present invention, in which the first chip 100 contains an HEMT MMIC 103 and the second chip 200 contains an HBT PA MMIC 203. The HEMT MIMIC 103 has a substrate 110 made of GaAs and consists of switches 121, capacitors 122, and inductors 124. It serves as an impedance tuner that achieves the impedance matching at the output of the HBT in the HBT PA MIMIC 203 operating at different bias conditions for the different output powers and frequencies to maintain an optimal performance. Since the output impedances are functions of the bias condition and the operating frequency, an impedance tuner is introduced to maintain a good impedance matching in accordance with the change in the operating condition. A dielectric layer 130 made of PBO is formed on the HEMT MMIC 103. The spiral inductor 124 is formed on the dielectric layer 130 using a first metal layer 140 made of Cu. The inductor 124 serves as a part of the impedance tuner circuit. In this embodiment, a direct electrical connection between an I/O pad 91 on a module substrate 90 and a connection node (one of the second pads 151) in the HEMT MIMIC 103 is made using the first metal layer 140 that extends over the electronic devices in the HEMT MMIC 103 in the three-dimensional manner and connects the two nodes apart from each other. Other descriptions of this embodiment are same to that of the embodiment 1.

Embodiment 6

Figure 10:
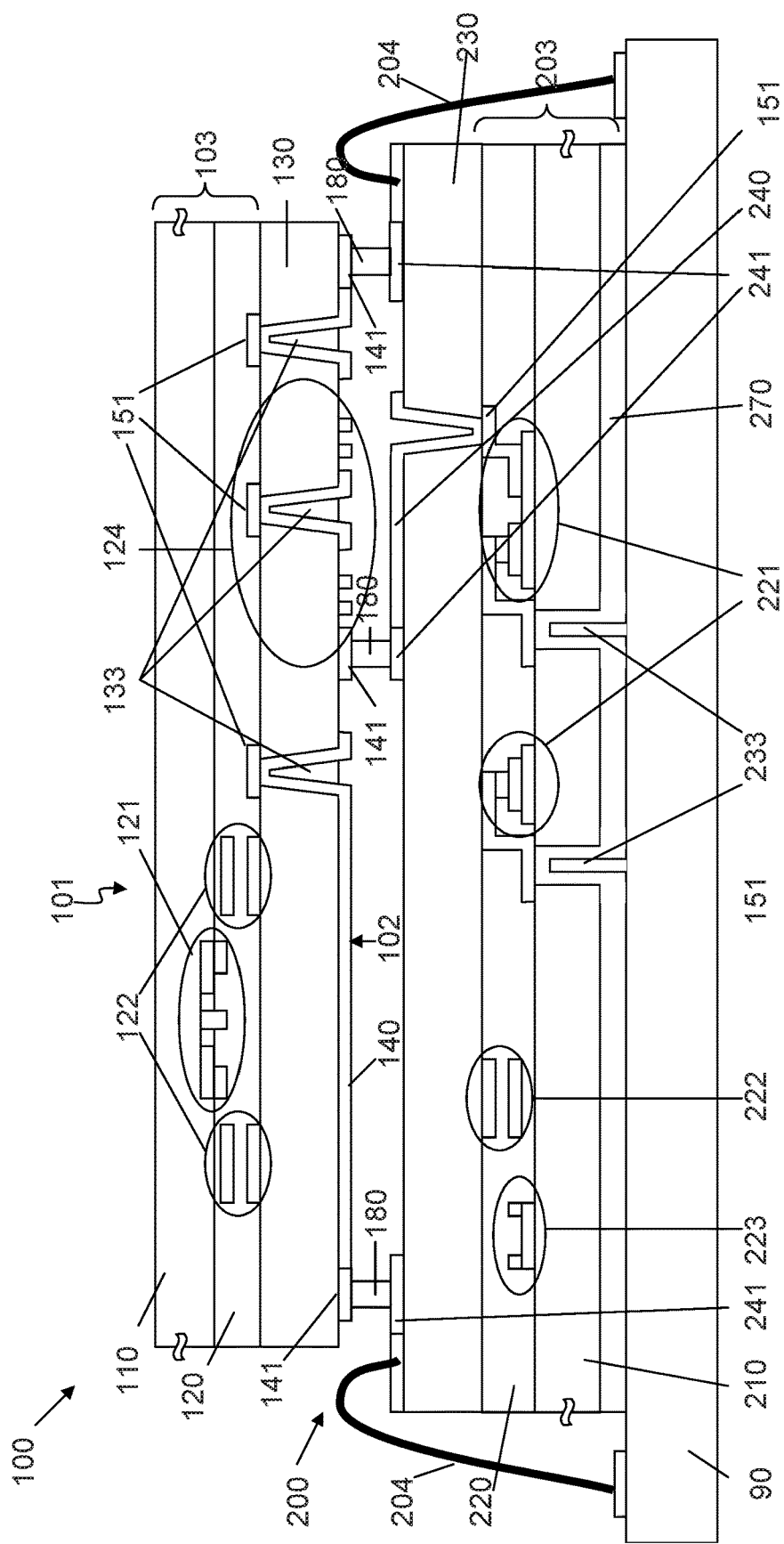

FIG. 10 is a schematic showing the cross-sectional view of another embodiment of the semiconductor integrated circuit according to the present invention, in which the first chip 100 contains an HEMT MMIC 103 and the second chip 200 contains an HBT PA MMIC 203. The descriptions for the HEMT MMIC 103 are same to that in the embodiment 5. The HBT PA MMIC 203 is similar to the HBT PA MIMIC 203 in the embodiment 3. However, a PBO layer 230 is formed on the HBT PA MIMIC 203, and a metal layer 240 made essentially of Cu is formed on the PBO layer 230. The metal layer 240 is regarded as the first metal layer. Other description regarding the type of metal, Au or Cu, for the first chip 100 also applies to the second chip 200. Since the Cu metal layer is formed on the front surface of both the first chip 100 and the second chip 200, there is more freedom in the layout design for connecting nodes in the circuits in the two chips at different horizontal positions. The second chip 200 is assembled on a module substrate 90 by wire bonding via bonding wires 204.

Embodiment 7

Figure 11:
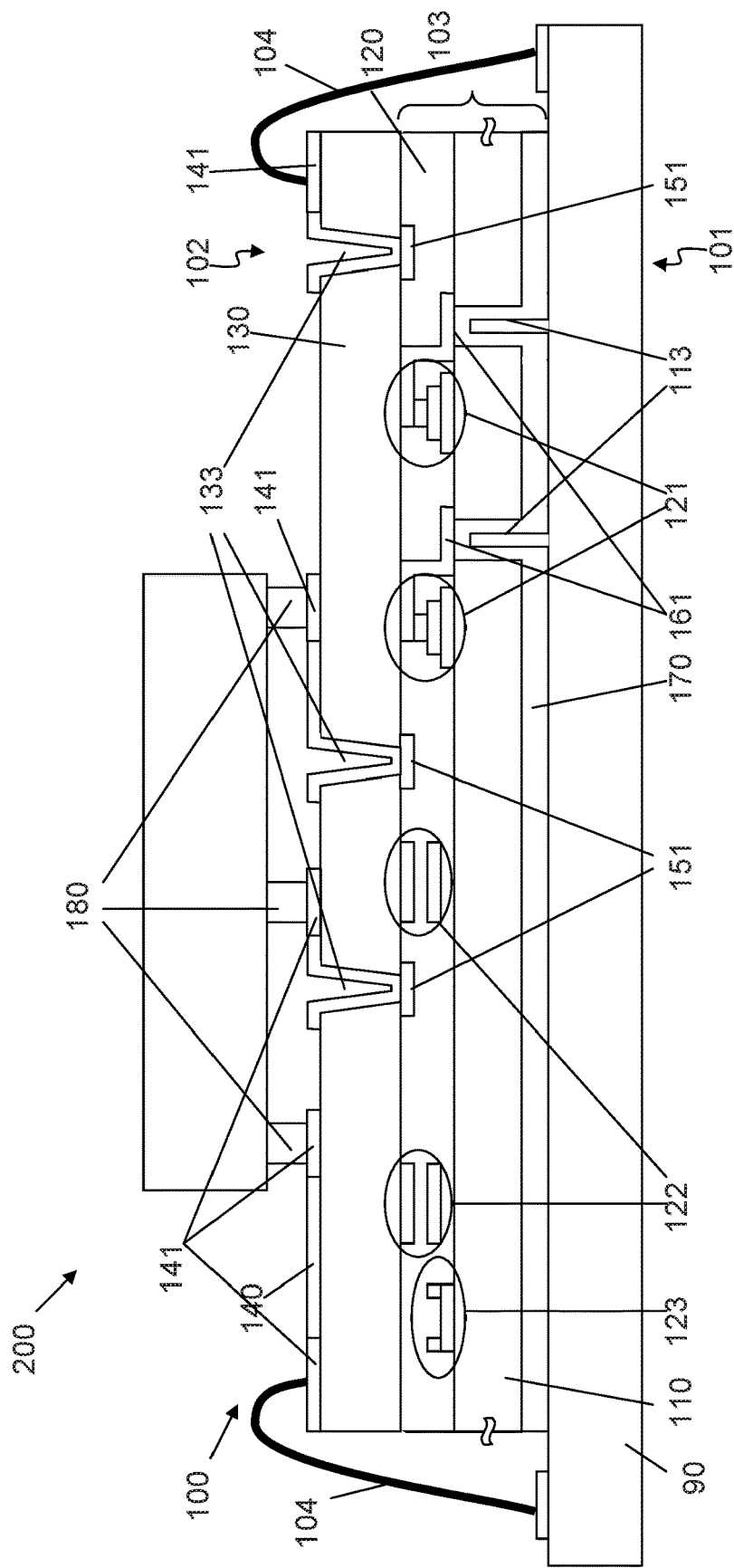

FIG. 11 is a schematic showing the cross-sectional view of another embodiment of the semiconductor integrated circuit according to the present invention, in which the first chip 100 contains an HBT PA MMIC 103 and the second chip 200 is an electronic chip other than a compound semiconductor chip. The second chip 200 in this embodiment is a Si CMOS IC consisting of bias control, switch and logic circuits and serves as a control circuit for controlling the bias condition of the HBT PA MMIC 103. A dielectric layer 130 made of PBO, the first metal layer 140 made of Cu, and plural bumps 180 made of Cu/solder are formed on the HBT PA MMIC 103 sequentially. The first metal layer 140, which connect the first pad 141 and the second pad 151 at the other end of a dielectric layer via hole 133 or to another first pad 141 to which the bonding wire is connected, is formed over the active region of a device in the HBT MIMIC 103 in the three-dimensional manner and connect the nodes in the two chips at positions away from each other. The electrical connections to the HBT PA MMIC are made through plural second pads 151 made of at least one second metal layer. In this embodiment, all of the at least one second metal layer, which provides connections to the HBTs 121 and other electronic devices 122 and 123, or forms the second pads 151 and the third pads 161, are made essentially of Au, so that the Cu metal layer can be kept away from the devices in the HBT PA MMIC. The degradation of devices in the HBT MMIC due to Cu atoms can thus be prevented. The connections between the HBT PA MMIC 103 and a module substrate 90 are made by wire bonding via bonding wires 104 and/or by a through substrate via hole 113 in the substrate 110 via a fourth metal layer 170.

Embodiment 8

Figure 12:
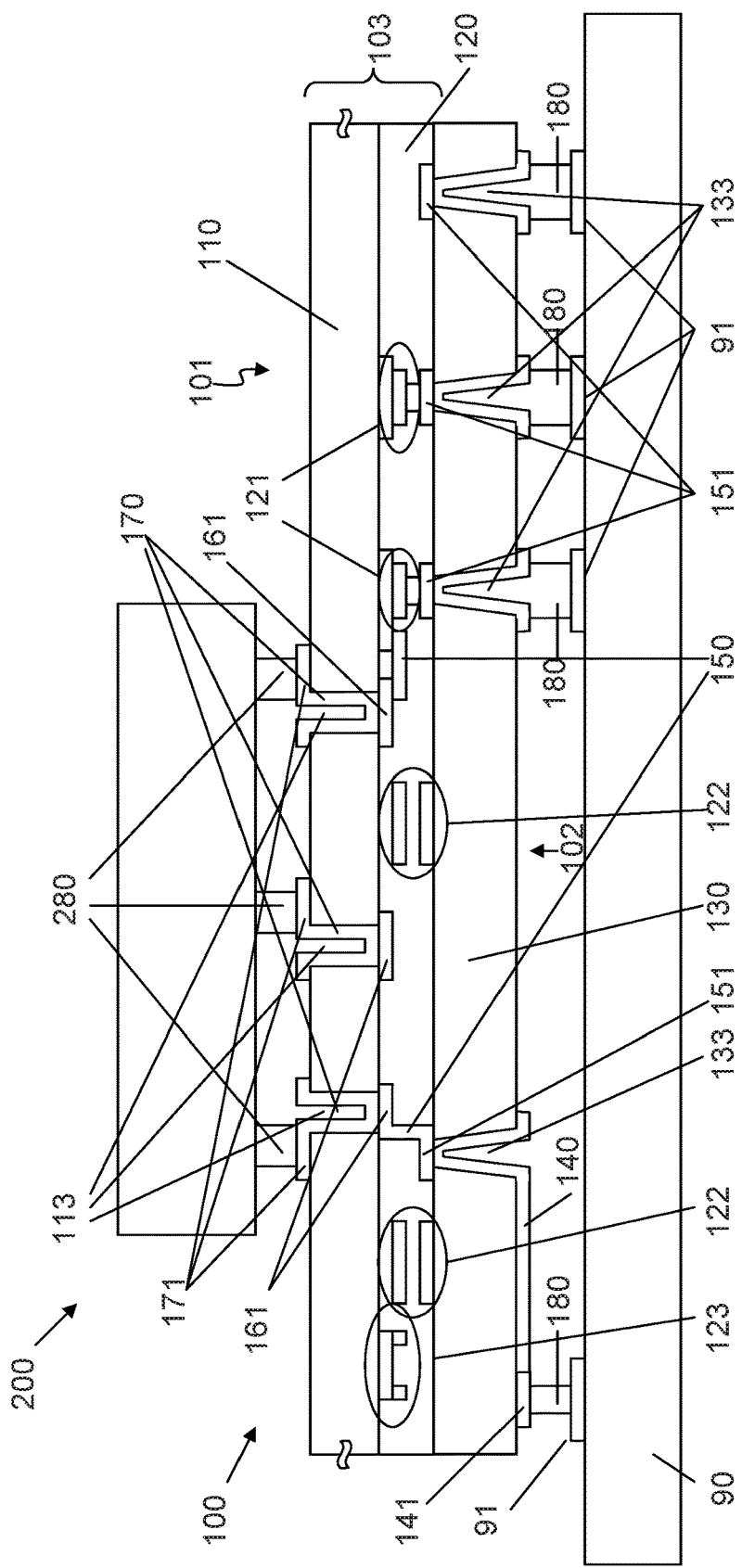

FIG. 12 is a schematic showing the cross-sectional view of another embodiment of the semiconductor integrated circuit according to the present invention, in which the first chip 100 contains an HBT PA MIMIC 103 and the second chip 200 is a Si CMOS IC chip for the bias control of the HBT PA MMIC 103. The first chip 100 is turned over and the second chip 200 is stacked on the back surface 101 of the first chip 100. The electrical connections between the two chips are made at the fourth pads 171 each formed by a third metal layer 170 on the back side of the substrate 110. Each of the fourth pads 171 is electrically connected through a through substrate via-hole 113 to the third pads 161, then to the electronic devices and the second pads 151 in the electronic device layer 120, all formed by the at least one second metal layer 150. In this embodiment, all of the at least one second metal layer 150 are made essentially of Au same as the embodiment 7, thereby preventing the contamination of the compound semiconductor devices with Cu. The first metal layer 140 made essentially of Cu is formed on a dielectric layer 130 made of PBO. The first metal layer 140 forms a first pad 141 which can be used for electrical connection to a module substrate 90. The dielectric layer 130 has plural dielectric layer via hole 133 penetrating through the dielectric layer 130. The first metal layer 140 extends from the dielectric layer via hole 133 to a first pad 141 connected to one of the I/O pads 91 on the module substrate 90 over the active region of a device in the HBT MIMIC in a three-dimensional manner to make an electrical connection between one of the fourth pads 171 on the back side of the substrate 110 and the I/O pad 91 on the module substrate 90 at different horizontal position. The first chip 100 is flip-chip assembled on the module substrate 90 with bumps 180 formed on the first pads 141 and on the emitter layers of the HBTs 121 through dielectric layer via holes 133.

Embodiment 9

Figure 13:
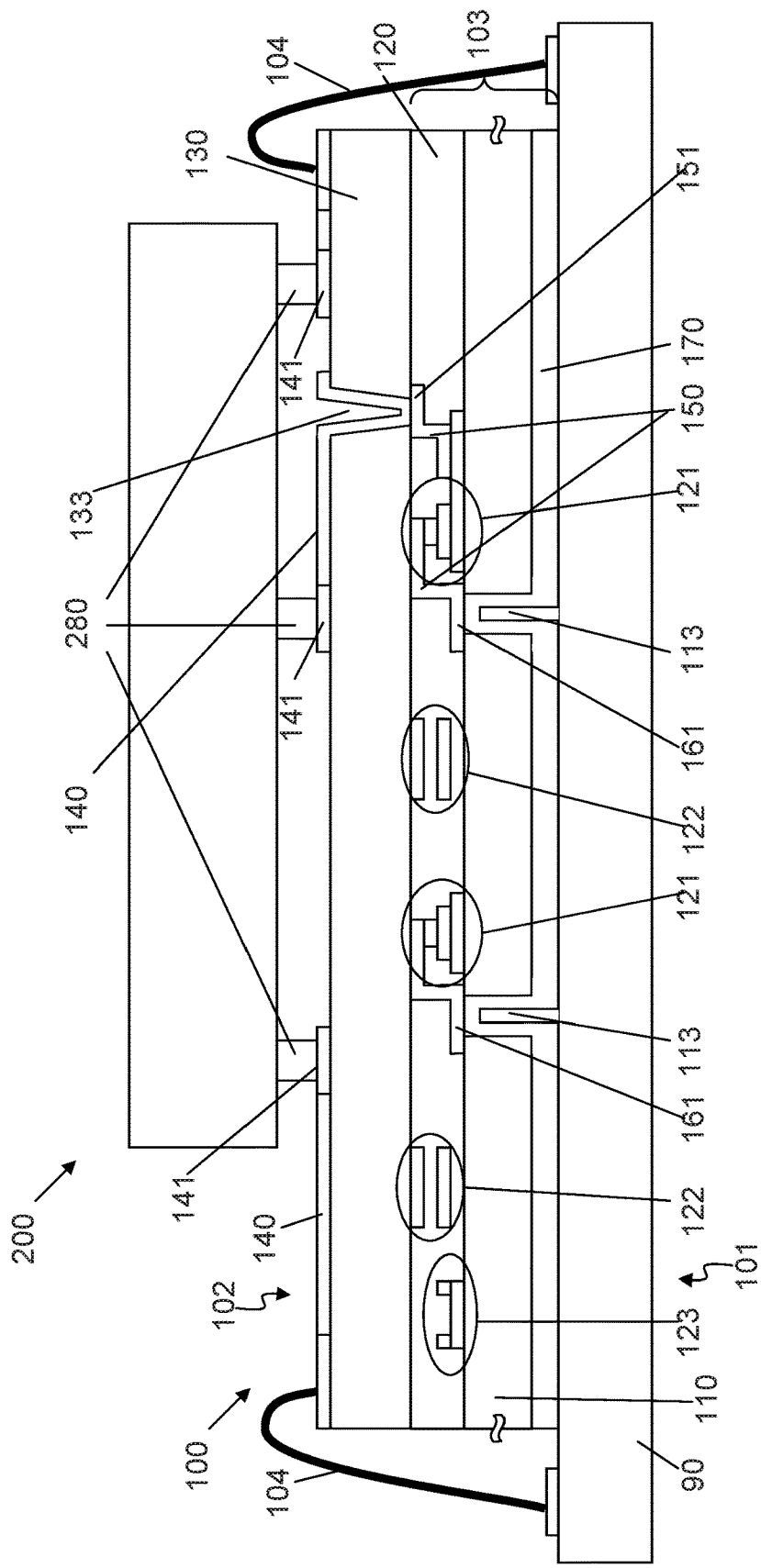

FIG. 13 is a schematic showing the cross-sectional view of another embodiment of the semiconductor integrated circuit according to the present invention, in which the first chip 100 contains an HBT PA MMIC 103 and the second chip 200 contains integrated passive devices (IPD) or a filter. The integrated passive devices can be formed on a substrate made of glass, silicon, or compound semiconductor such as GaAs. The IPD serves as a filter, an impedance matching circuit, etc. The second chip 200 may also contain an acoustic filter such as a surface or a bulk acoustic wave filter, a film bulk acoustic wave filter, etc., and can be fabricated on a substrate such as Si. The second chip 200 is stacked on the front surface 102 of the first chip 100. The descriptions for the fabrication process of the first chip are same to that in embodiment 7.

Embodiment 10

Figure 14:
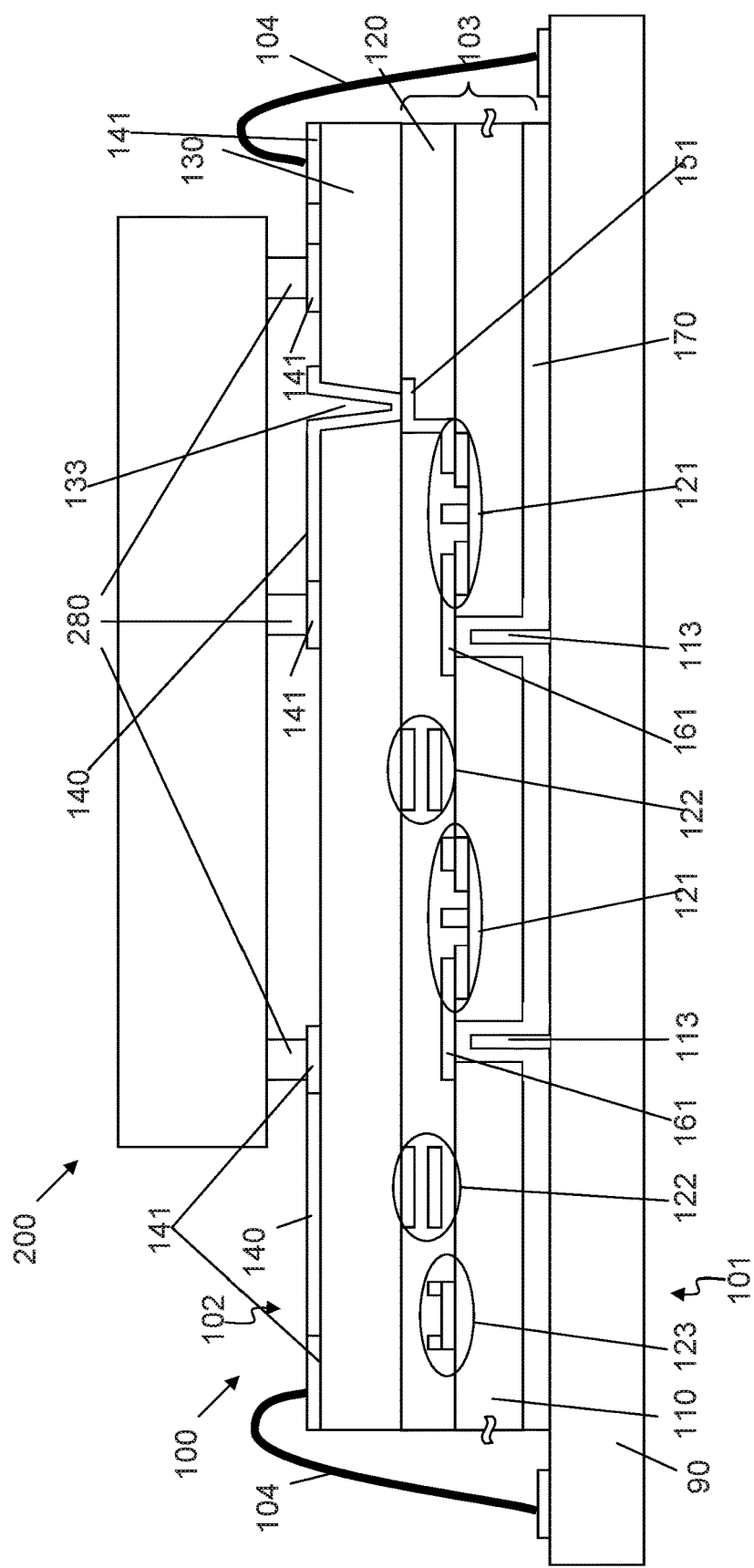

FIG. 14 is a schematic showing the cross-sectional view of another embodiment of the semiconductor integrated circuit according to the present invention. The design of this embodiment is similar to that of the embodiment 9, except that the HBT PA MIMIC in the first chip 100 is replaced by a HEMT PA MIMIC 103.

Embodiment 11

Figure 15:
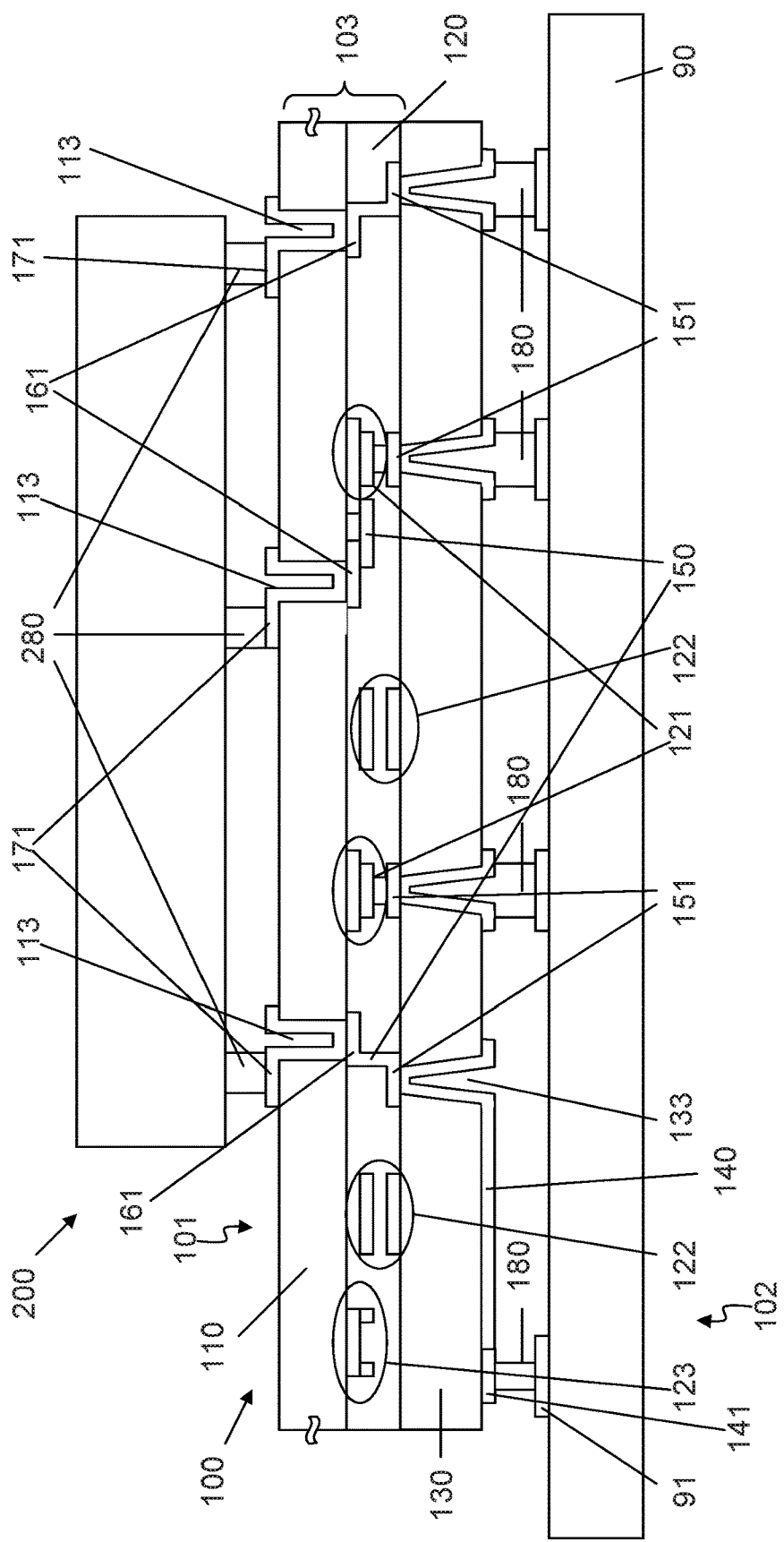

FIG. 15 is a schematic showing the cross-sectional view of another embodiment of the semiconductor integrated circuit according to the present invention. The design of this embodiment is similar to that of the embodiment 9, except that the first chip 100 is flip-chip assembled on the module substrate 90 as described in the embodiment 8.

Embodiment 12

Figure 16:
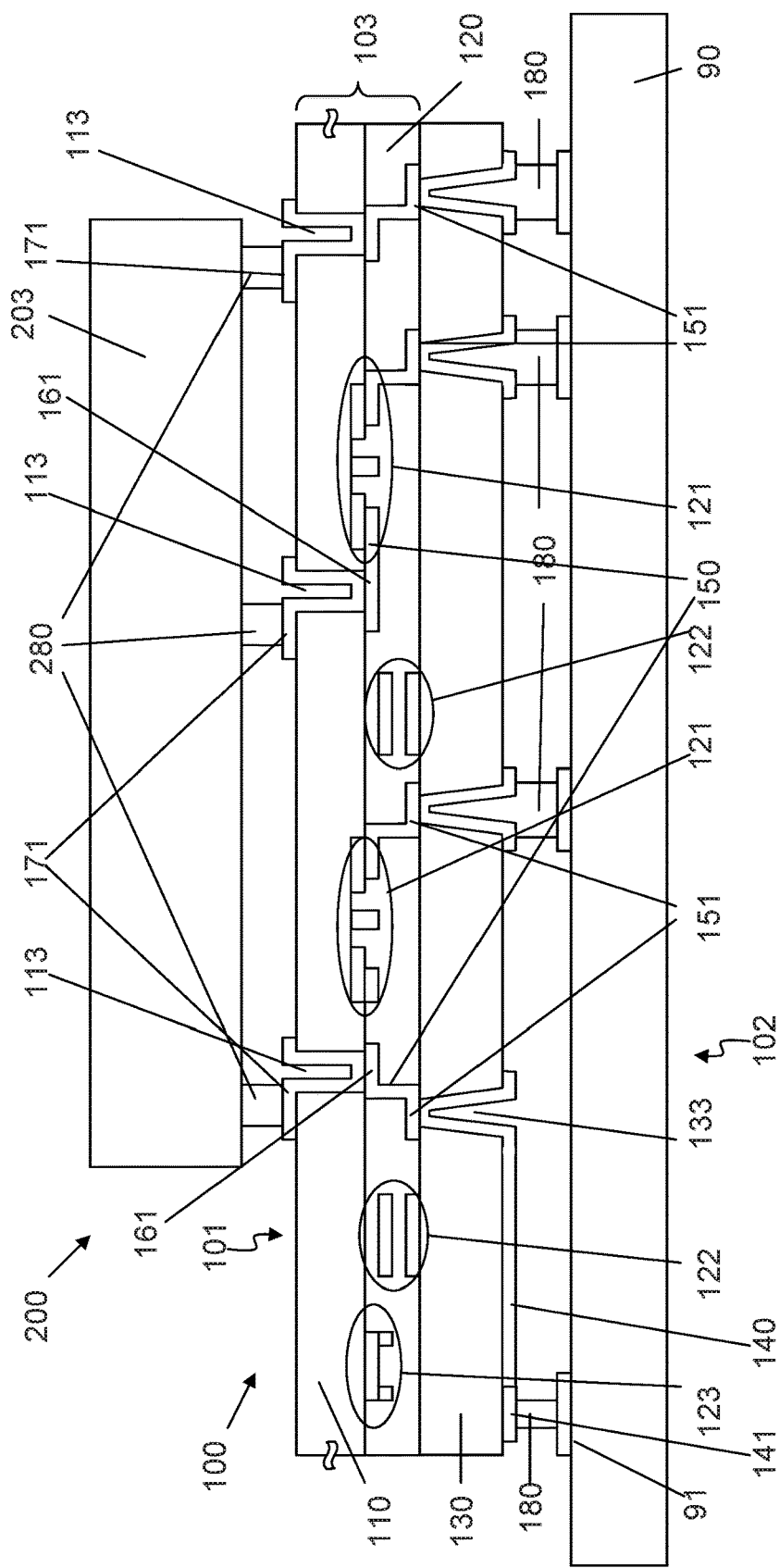

FIG. 16 is a schematic showing the cross-sectional view of another embodiment of the semiconductor integrated circuit according to the present invention. The design of this embodiment is similar to that of the embodiment 11, except that the HBT PA MMIC in the first chip 100 is replaced by a HEMT PA MIMIC 103.

Embodiment 13

Figure 17:
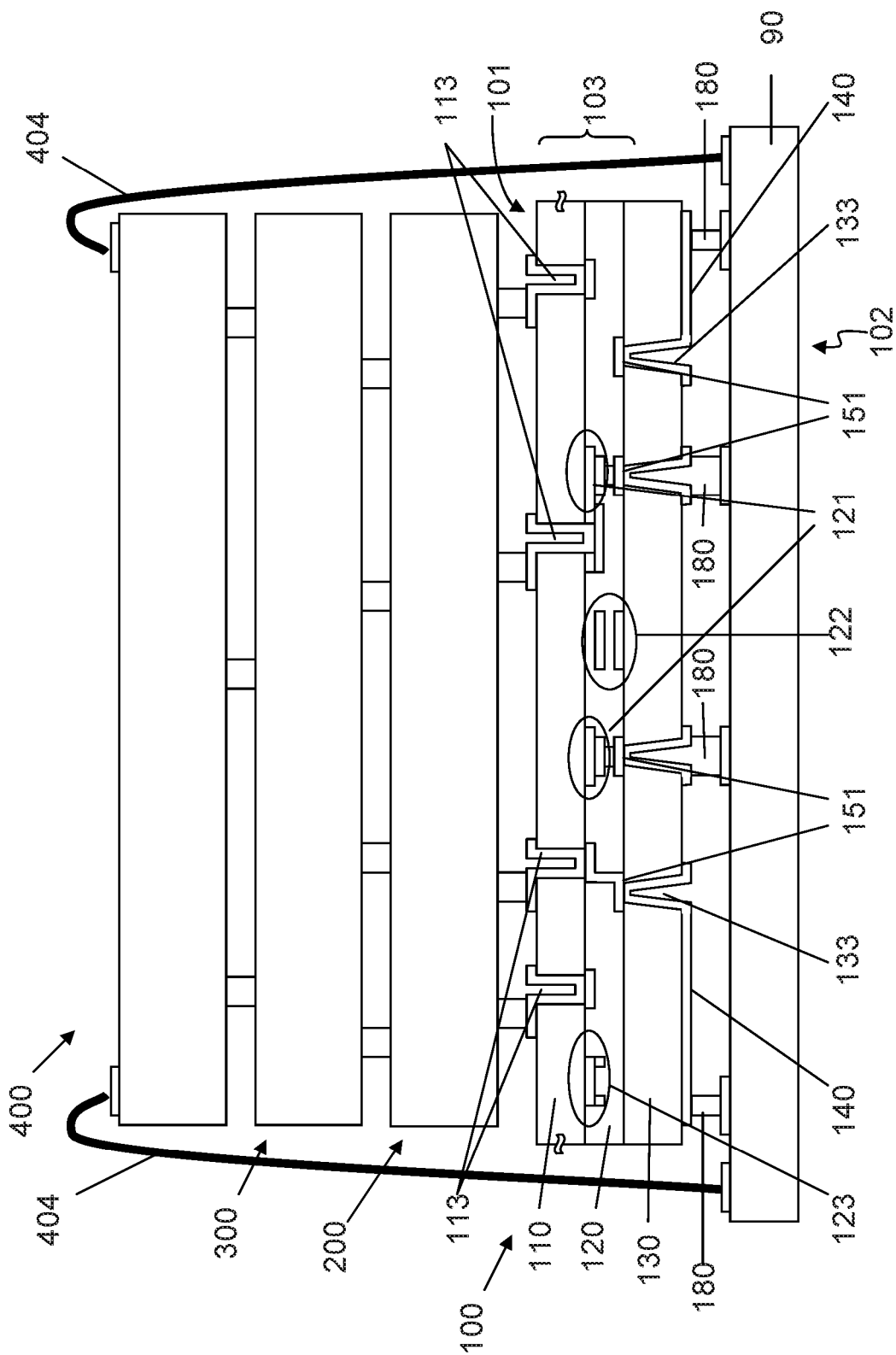

FIG. 17 is a schematic showing the cross-sectional view of another embodiment of the semiconductor integrated circuit according to the present invention, which includes multiple stacked chips. In this embodiment, the semiconductor integrated circuit comprises a first chip 100 containing an HBT PA MMIC 103, a second chip 200 containing an impedance matching circuit (integrated passive devices) and a bias control circuit, a third chip 300 containing an antenna switch circuit, and a fourth chip 400 containing a filter. The second chip 200 is stacked on the back surface 101 of the first chip 100, the third chip 300 is stacked on the second chip 200, and the fourth chip 400 is stacked on the third chip 300. The descriptions for the fabrication process of the HBT PA MMIC 103 are the same as that in the embodiment 8. The connection to a module substrate 90 is made both by bumps 180 formed on the front surface 102 of the first chip 100 and by wire bonding via bonding wires 404 made on the filter chip 400.

Embodiment 14

Figure 18:
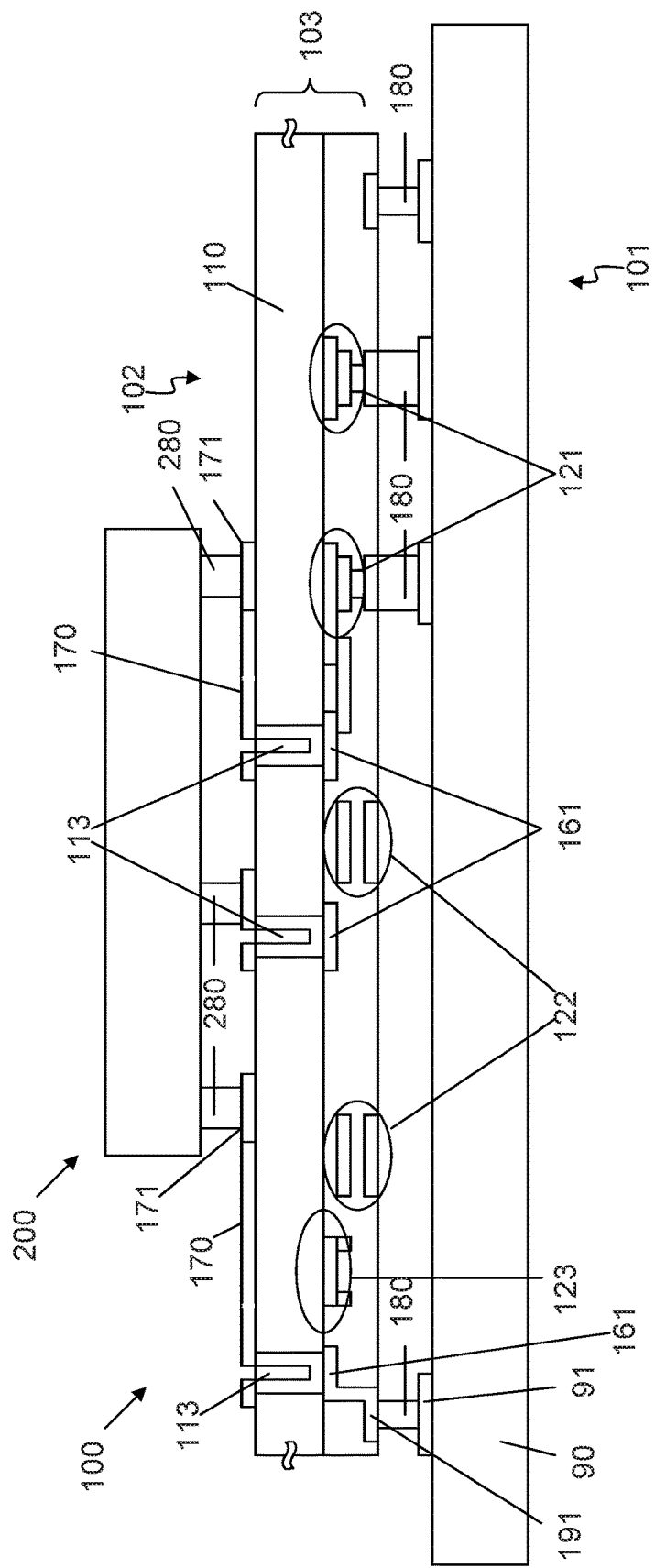

FIG. 18 is a schematic showing the cross-sectional view of another embodiment of the semiconductor integrated circuit according to the present invention, in which the first chip 100 contains an HBT PA MMIC 103 and the second chip 200 is an electronic chip. The first chip 100 is turned over and flip-chip assembled on a module substrate 90. The second chip 200 is stacked on the back surface 102 of the overturned first chip 100. The second chip 200 consists of bias control, switch, and logic circuits and serves as a control circuit for controlling the bias condition of the HBT PA MMIC 103, and/or a switch circuit that switches the RF signal paths in the HBT PA MMIC in the first chip 100. The second chip 200 is either a compound semiconductor MIMIC such as an HEMT MMIC or a Si CMOS IC. In the first chip 100, the third metal layer 170 forms at least one fourth pad 171 on the back surface 102 of the first chip and extends into the through substrate via hole 113. One of the second metal layers 150 forms a third pad 161 at the end of the through substrate via hole 113 opposite to the fourth pad 171, at which the third pad 161 is electrically connected to the third metal layer 170 that extends into the through substrate via hole 113. The third pad 161 is electrically connected to HBT 121 by the second metal layer 150. The third pad is also electrically connected to the fifth pad 191 formed at the surface of the electronic device layer opposite to the substrate. The fifth pad 191 is further connected to the I/O pad 91 on the module substrate 90. The fourth pad 171 is electrically connected to the second chip 200 through bumps 280. The third metal layer 170 is formed over a resistor 123, capacitor 122, and HBT 121 in the first chip in a three-dimensional manner. In this way, the connection between the two chips having connection nodes at horizontal position apart from each other can be made. The third metal layer 170 is preferably made of plating Cu with Pd as a seed metal.

Embodiment 15

Figure 19:
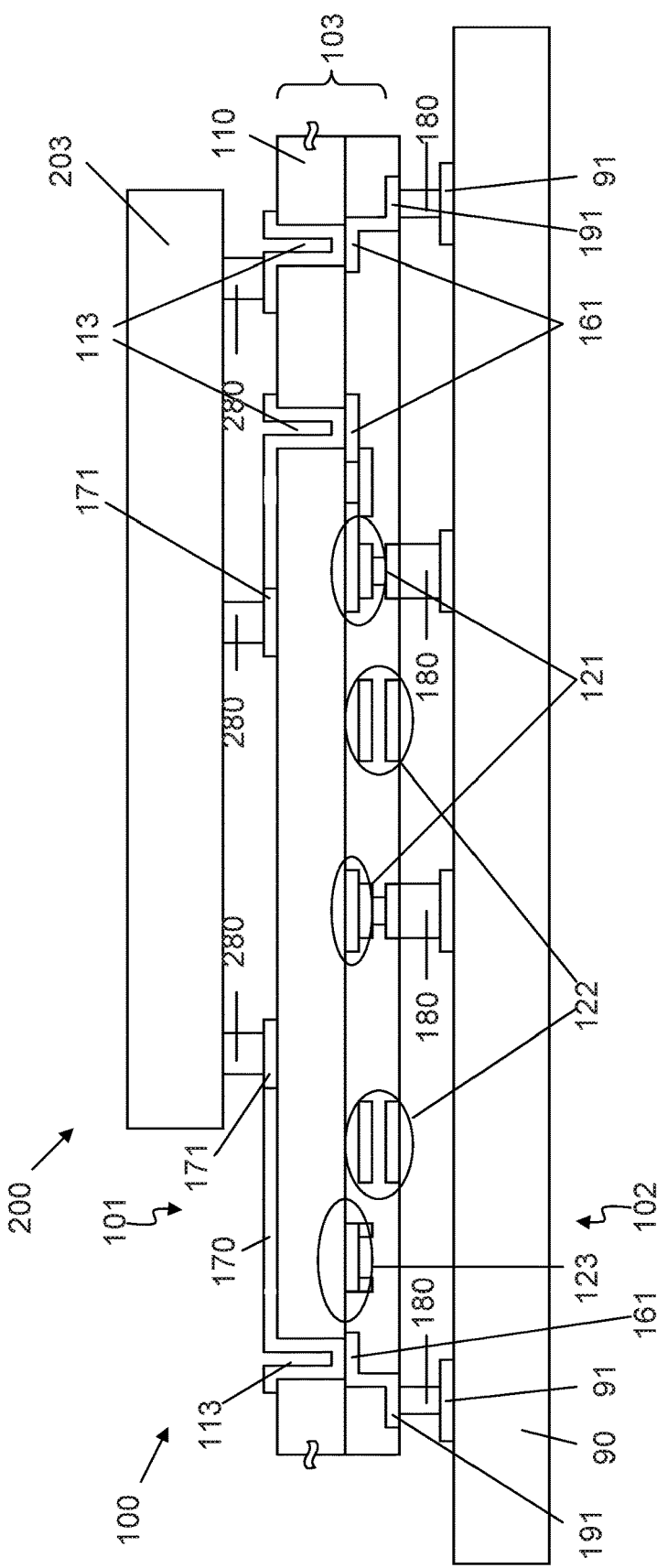

FIG. 19 is a schematic showing the cross-sectional view of another embodiment of the semiconductor integrated circuit according to the present invention, in which the first chip 100 contains an HBT PA MMIC 103 and the second chip 200 contains an impedance matching circuit consisting of inductors and/or capacitors formed on a substrate made of Si, GaAs, or glass for matching the output impedance of the HBT in the first chip 100. The second chip 200 is stacked on back surface 101 of the overturned first chip 100. The second chip 200 may also contain an impedance tuner used to obtain the output impedance matching to the HBT in the first chip 100 at various different operation conditions. The second chip 200 may also contain a filter circuit that filters out unwanted signals generated by the HBT in the first chip 100 at frequencies different from the fundamental frequency, consisting of either integrated passive devices formed on a Si, a GaAs, or a glass substrate, or an acoustic filter such as surface, bulk and film bulk acoustic filters. The description for the fabrication process of the first chip 100 is the same as Embodiment 14.

Embodiment 16

Figure 20:
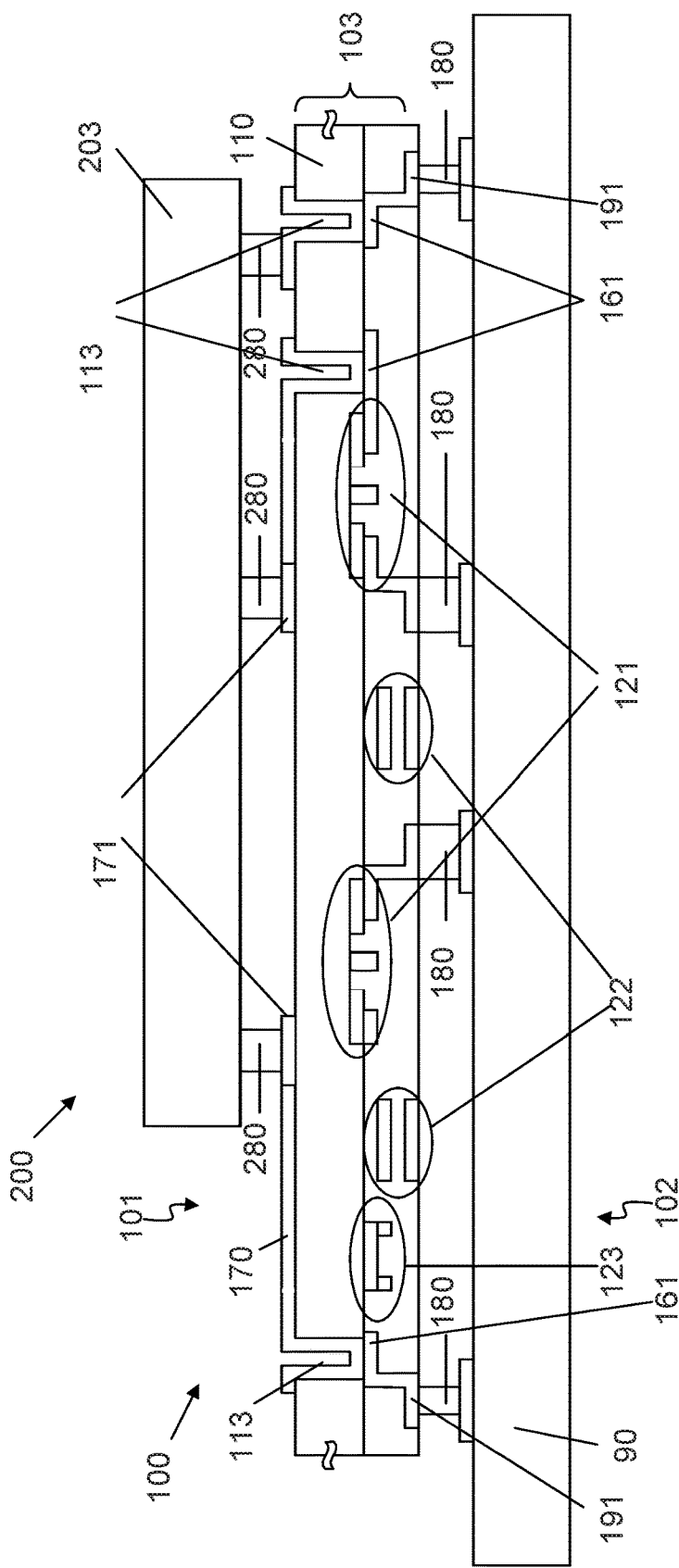

FIG. 20 is a schematic showing the cross-sectional view of another embodiment of the semiconductor integrated circuit according to the present invention. The design of this embodiment is similar to that of the embodiment 15, except that the HBT PA MMIC in the first chip 100 is replaced by a HEMT PA MMIC 103.

Embodiment 17

Figure 21:
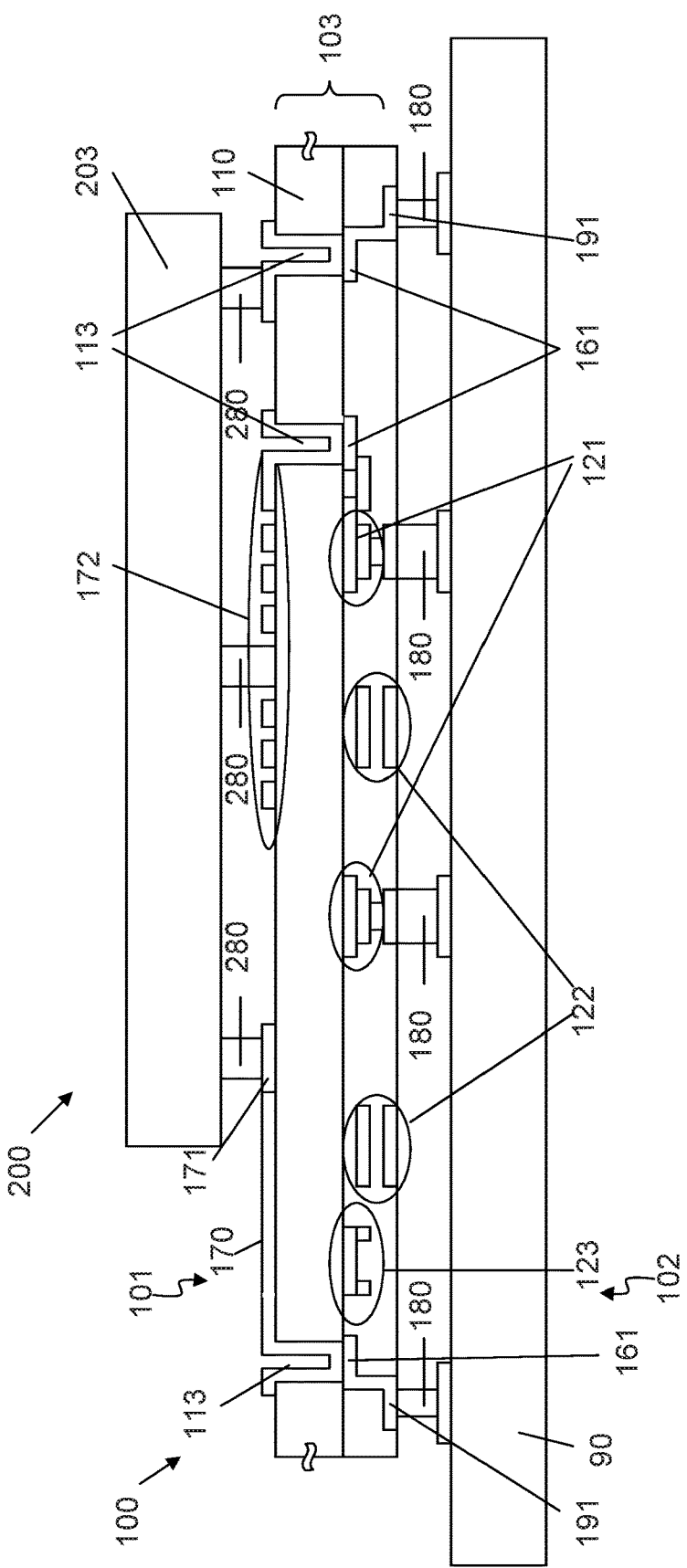

FIG. 21 is a schematic showing the cross-sectional view of another embodiment of the semiconductor integrated circuit according to the present invention. The design of this embodiment is mostly similar to that of the embodiment 15. In this embodiment, the fourth metal layers 170 forms a spiral inductor 172 on the back surface 101 of the first chip 100. The inductor 172 is electrically connected to the MIMIC in the first chip 100 through a through substrate via hole 113. The inductor 172, the MMIC in the first chip, and the second chip form an impedance matching and tuning circuit. The metal layers 170 are made preferably of Cu or multiple metal layers containing Cu layer for low signal loss owing to its high conductivity.

Embodiment 18

Figure 22:
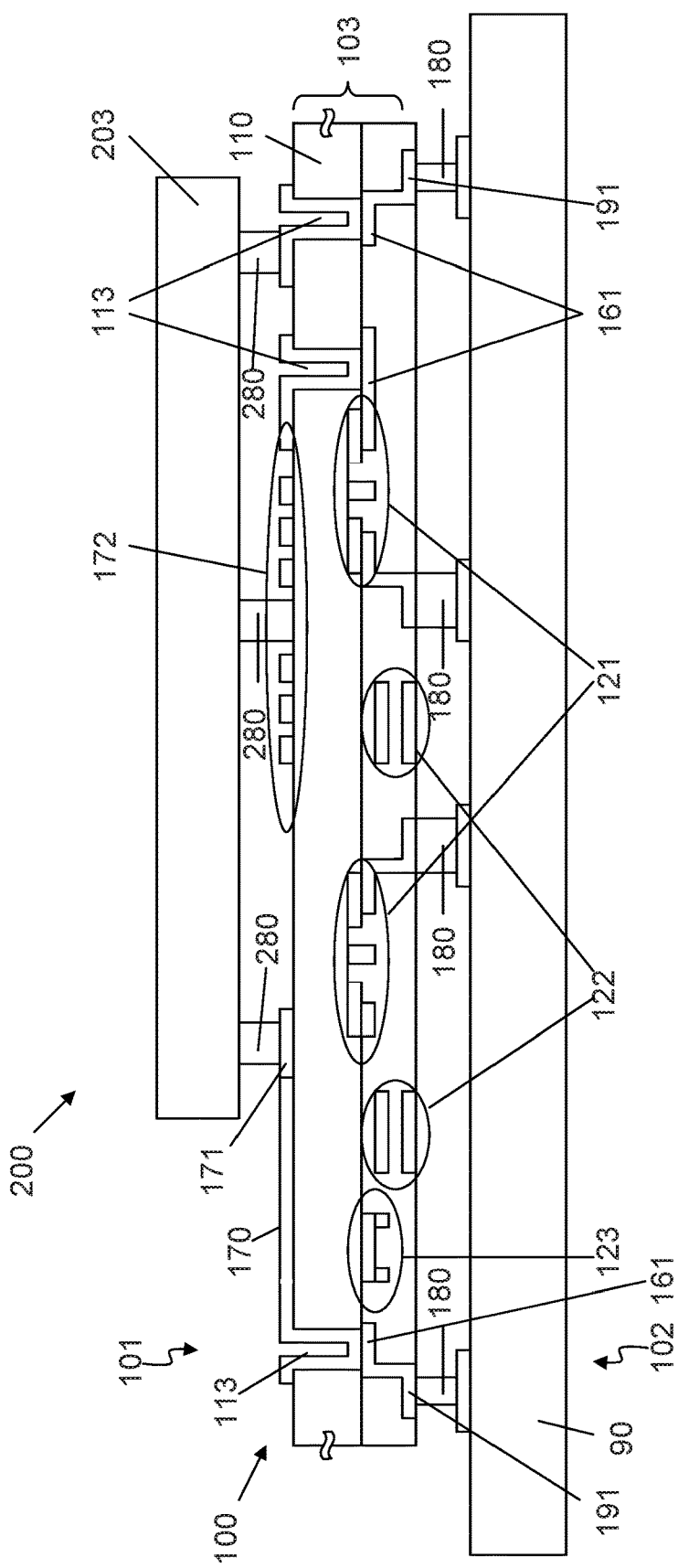

FIG. 22 is a schematic showing the cross-sectional view of another embodiment of the semiconductor integrated circuit according to the present invention. The design of this embodiment is similar to that of the embodiment 17, except that the HBT PA MMIC in the first chip 100 is replaced by a HEMT PA MMIC 103.

Embodiment 19

Figure 23:
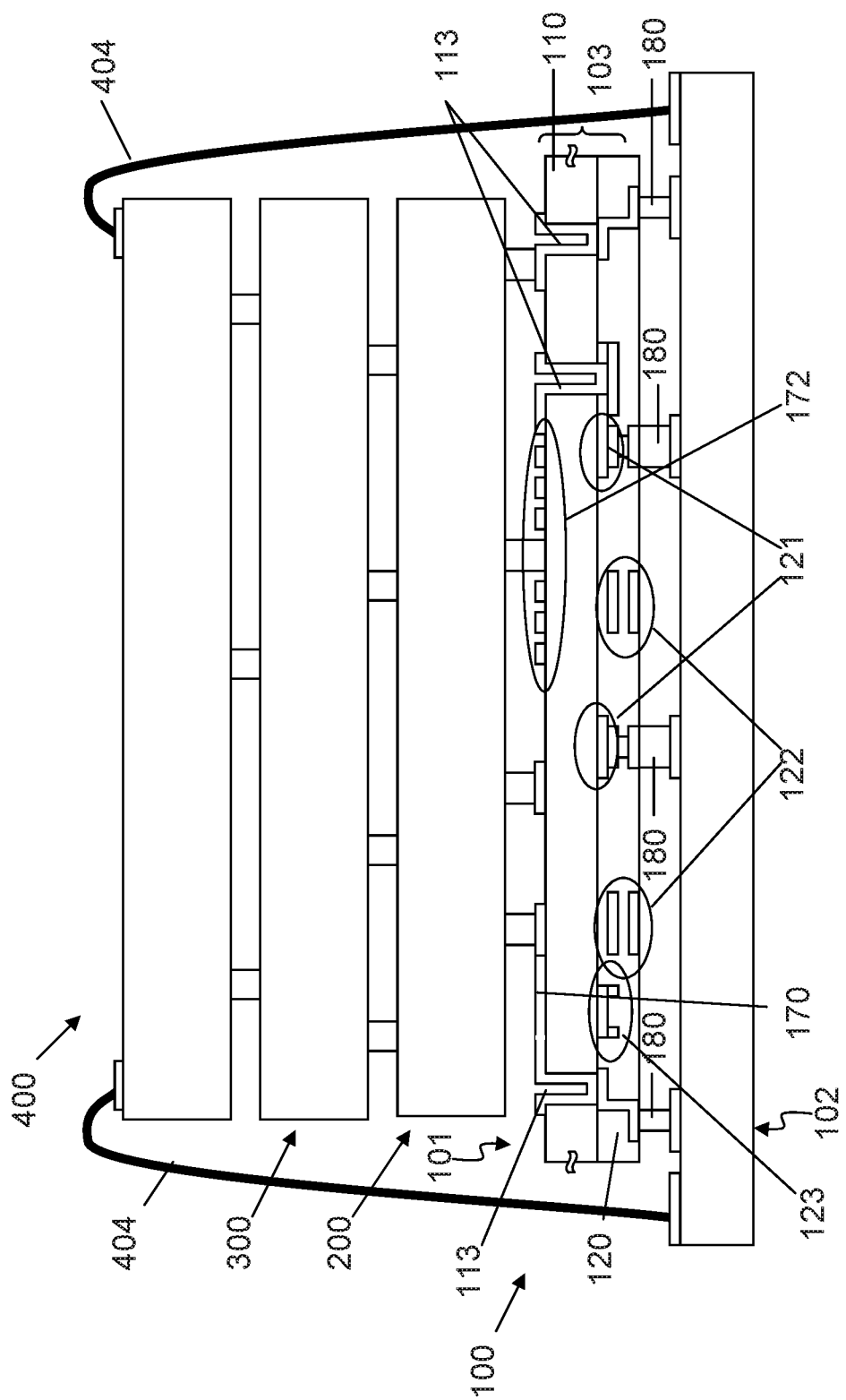

FIG. 23 is a schematic showing the cross-sectional view of another embodiment of the semiconductor integrated circuit according to the present invention, which includes multiple stacked chips. The design of this embodiment is similar to that of the embodiment 13, except that the first chip 100 is designed similarly to the first chip 100 in the embodiment 17.

To sum up, the present invention can indeed get its anticipated object to provide a semiconductor integrated circuit, which comprises stacked electronic chips, in which at least one of the chips is a compound semiconductor electronic integrated circuit chip. The present invention has the following advantages:

1. By using the stacked chips scheme to compose a module, the elements in the module can be formed on separated chips. Since each of the chips can have its optimal layout design and can be fabricated with processes only required for the each chip, the overall manufacturing cost can be reduced compared with the case in which the circuit elements are integrated in one chip. The areal size of the whole module can also be made smaller than the case in which the chips are placed laterally on the module substrate.

2. The interconnections between chips or between two circuit elements can be made by using the metal layers formed on the front surface or the back surface of the chips. The front surface/back surface metal layers can be formed over the device active region which makes it possible to connect nodes in two chips at positions apart from each other horizontally. Therefore, there is more freedom in the layout design of the connection nodes. The interconnections can be made short to reduce the signal loss and interference compared to the case in which chips are placed laterally on a module substrate.

3. While Cu is used for the interconnections between chips, Au is used for the metal layers in contact with the compound semiconductor devices. In this way, the degradation of the electrical performance of the compound semiconductor by Cu atom in-diffusion is prevented. Furthermore, by completely avoiding the use of Cu layer in the formation of the electronic device layer, which is the essential part of the front-end process, the process steps involving the formation of Cu layer is brought into the back-end process. Thus, the cross-contamination of the front-end process by Cu atoms is completely prevented. A high long-term reliability is maintained even though the Cu metallization process is used in the compound semiconductor MIMIC process.

4. The metal layer on the back surface of a chip can be used to form an inductor or other passive electronic devices. The inductor on the back surface of the chip further save the space occupied by the whole circuit, and therefore the chip size can be reduced. The high quality factor for the inductor on the back side of the chip can be obtained when the back side metal layer contains Cu.

The use of the compound semiconductor integrated circuit chip with the front surface metal layer over the device active region can also be extended to cases without a stacked chip. The compound semiconductor integrate circuit chip can be connected to any electronic circuits through the front surface metal layer, such as the case when the chip is mounted on a module substrate with the electrical connection made by bump bonding or wire bonding between a pad formed on the module substrate and a pad formed with the front surface metal layer. Thus, more freedom in the layout design of the pad location is obtained.

The description referred to the drawings stated above is only for the preferred embodiments of the present invention. Many equivalent local variations and modifications can still be made by those skilled at the field related with the present invention and do not depart from the spirits of the present invention, so they should be regarded to fall into the scope defined by the appended claims.

What is claimed is:

1. A method for fabricating a compound semiconductor integrated chip, sequentially comprising steps of:
   growing at least one compound semiconductor epitaxial layer on a substrate of a chip;
   fabricating at least one compound semiconductor electronic device on the substrate using the at least one compound semiconductor epitaxial layer;
   depositing at least one second metal layer made essentially of Au above the at least one compound semiconductor epitaxial layer to form an electrical connection to at least one of the at least one compound semiconductor electronic device, and also to form at least one second pad;
   depositing a SiN layer above the at least one second metal layer for passivation or protection of the at least one compound semiconductor electronic device;
   depositing a dielectric layer above the SiN layer;
   forming at least one dielectric layer via hole penetrating through the dielectric layer for the electrical contact to the at least one second pad; and
   depositing a first metal layer made essentially of Cu on the dielectric layer forming at least one first pad on the dielectric layer, the first metal layer extending from each of the at least one first pad into the at least one dielectric layer via hole and connecting to the at least one second pad, where the first metal layer extends from at least one of the at least one first pad three-dimensionally over at least one of the at least one compound semiconductor device, then into the at least one dielectric layer via hole and connects to the at least one second pad.

2. The method of claim 1, wherein the substrate of the chip is made of GaAs, Si, SiC, or GaN.

3. The method of claim 1, wherein the dielectric layer is made of Polybenzoxazole (PBO).

4. The method of claim 1, wherein the thickness of the dielectric layer is 10 μm or thicker.

5. The method of claim 1, wherein the first pad is for connecting another chip to the chip.

* * * * *